United States Patent
Fukuzumi et al.

(10) Patent No.: US 8,692,312 B2
(45) Date of Patent: Apr. 8, 2014

(54) SEMICONDUCTOR MEMORY DEVICE AND METHOD OF MANUFACTURING THE SAME

(75) Inventors: Yoshiaki Fukuzumi, Yokohama (JP); Masaru Kito, Kuwana (JP); Takeshi Imamura, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/428,506

(22) Filed: Mar. 23, 2012

(65) Prior Publication Data

US 2013/0062683 A1     Mar. 14, 2013

(30) Foreign Application Priority Data

Sep. 9, 2011    (JP) .................................. 2011-197255

(51) Int. Cl.
     *H01L 29/792*      (2006.01)

(52) U.S. Cl.
     USPC .................... 257/324; 257/E21.423; 438/287

(58) Field of Classification Search
     USPC .......... 438/287, 268; 257/324–326, E21.423, 257/E29.309
     See application file for complete search history.

(56) References Cited

U.S. PATENT DOCUMENTS

| | | | |
|---|---|---|---|
| 4,996,572 A * | 2/1991 | Tanaka et al. | 257/317 |
| 7,847,334 B2 | 12/2010 | Katsumata | |
| 7,936,004 B2 | 5/2011 | Kito et al. | |
| 2008/0180994 A1 * | 7/2008 | Katsumata et al. | 365/174 |
| 2009/0230458 A1 * | 9/2009 | Ishiduki et al. | 257/324 |
| 2010/0207195 A1 | 8/2010 | Fukuzumi et al. | |
| 2010/0213538 A1 * | 8/2010 | Fukuzumi et al. | 257/326 |
| 2011/0180866 A1 * | 7/2011 | Matsuda et al. | 257/324 |
| 2012/0052672 A1 * | 3/2012 | Nakanishi et al. | 438/591 |

FOREIGN PATENT DOCUMENTS

JP      2009-224465      10/2009

* cited by examiner

*Primary Examiner* — Shaun Campbell
(74) *Attorney, Agent, or Firm* — Oblon, Spivak, McClelland, Maier & Neustadt, L.L.P.

(57) ABSTRACT

According to one embodiment, a method of manufacturing a semiconductor memory device is provided. In the method, a laminated body in which a first silicon layer, a first sacrificial layer, a second silicon layer, and a second sacrificial layer are laminated in turn is formed. A first insulating film is formed on the laminated body. A trench is formed in the laminated body and the first insulating film. A third sacrificial layer is formed into the trench. The third sacrificial layer is etched by wet etching to be retreated from a top surface of the third sacrificial layer, thereby etching end faces of the first sacrificial layer and the second sacrificial layer.

8 Claims, 19 Drawing Sheets

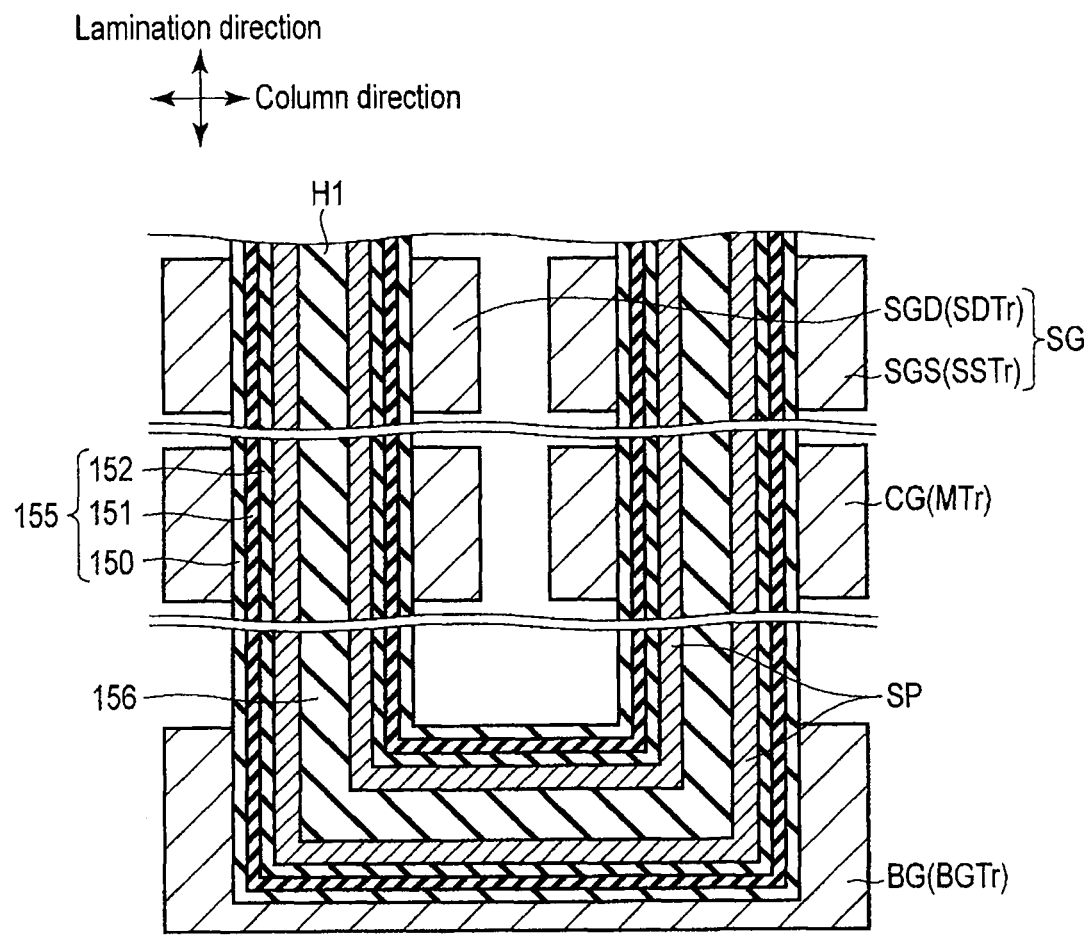
F I G. 3

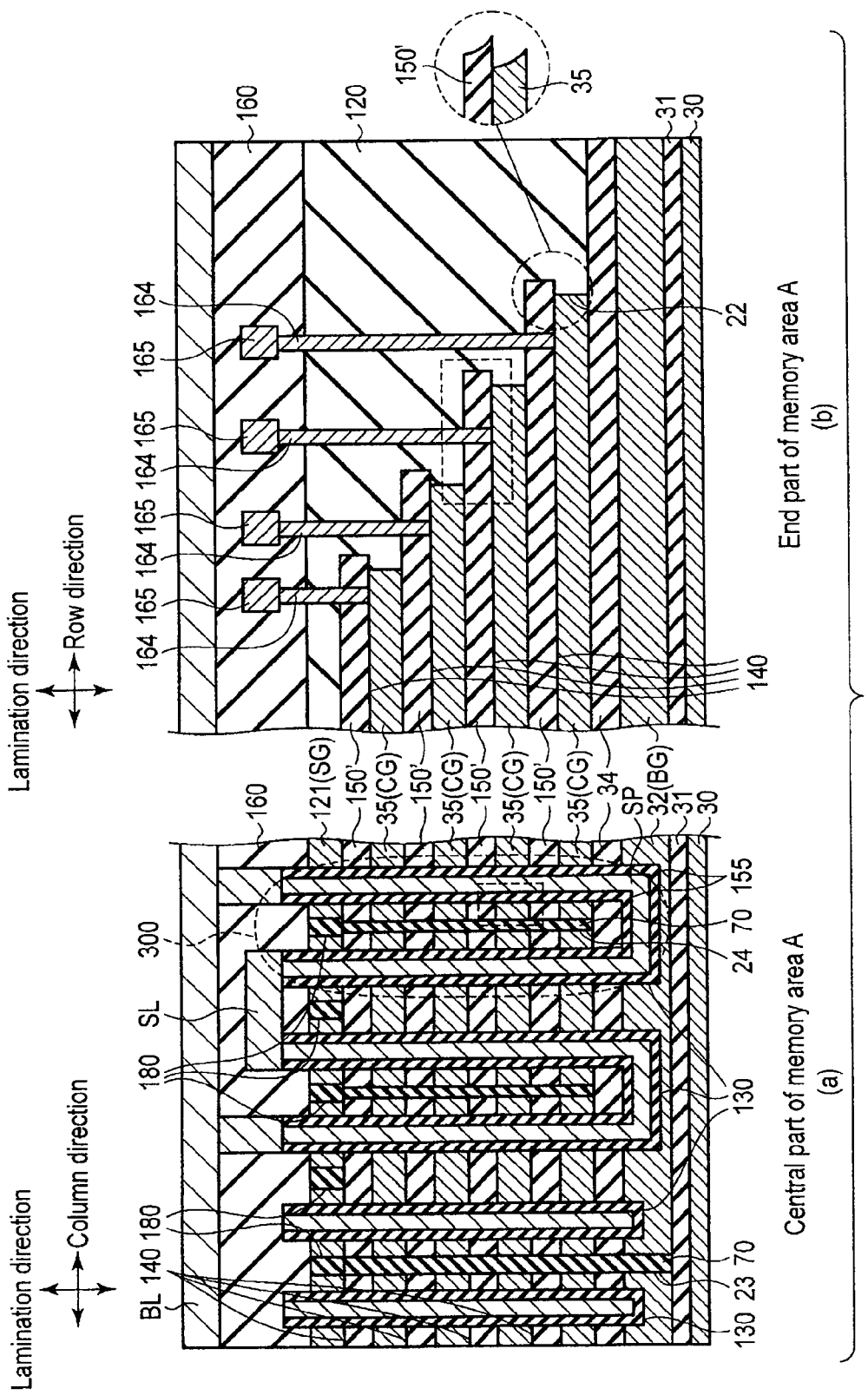
F I G. 5

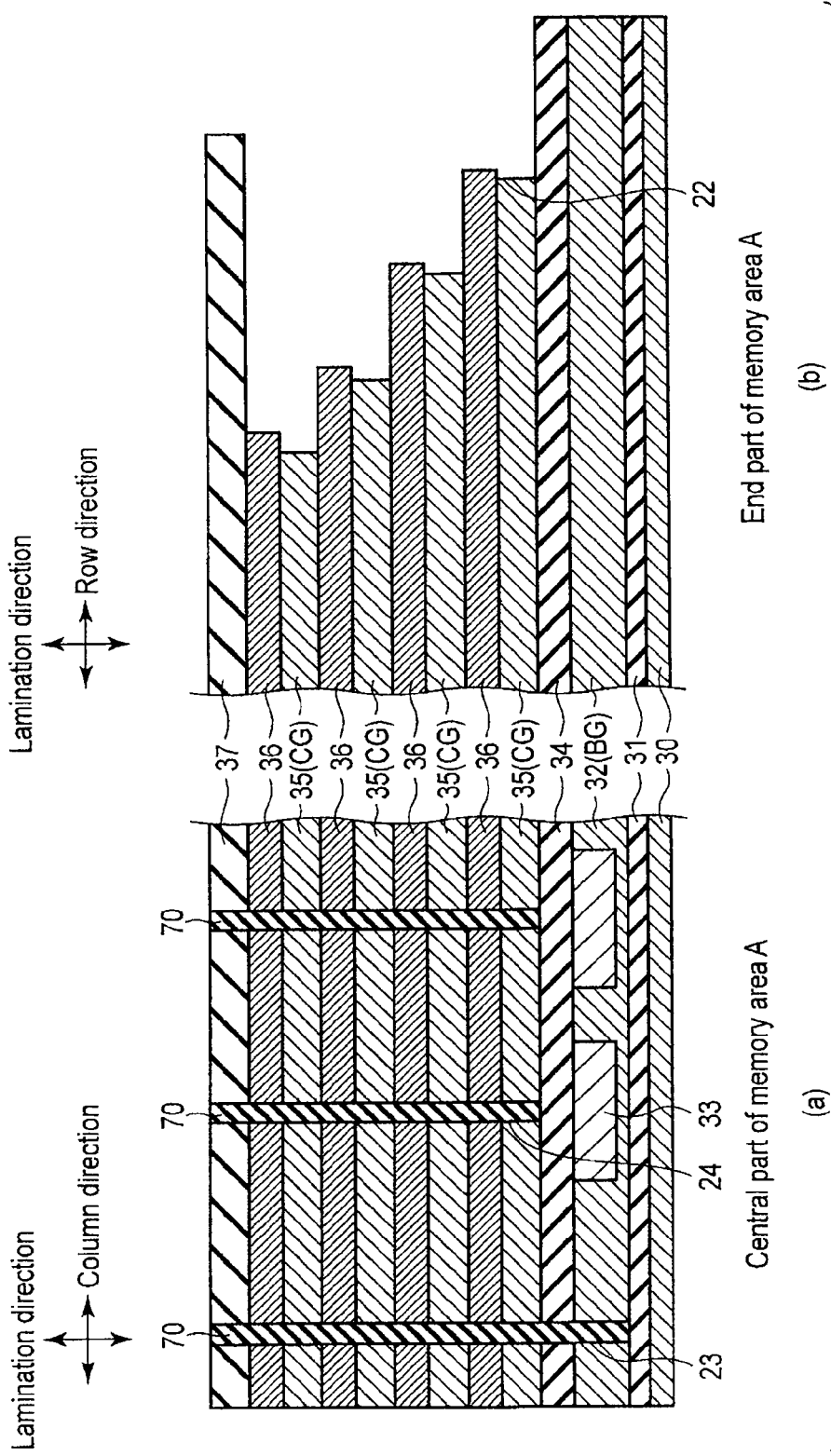
F I G. 12

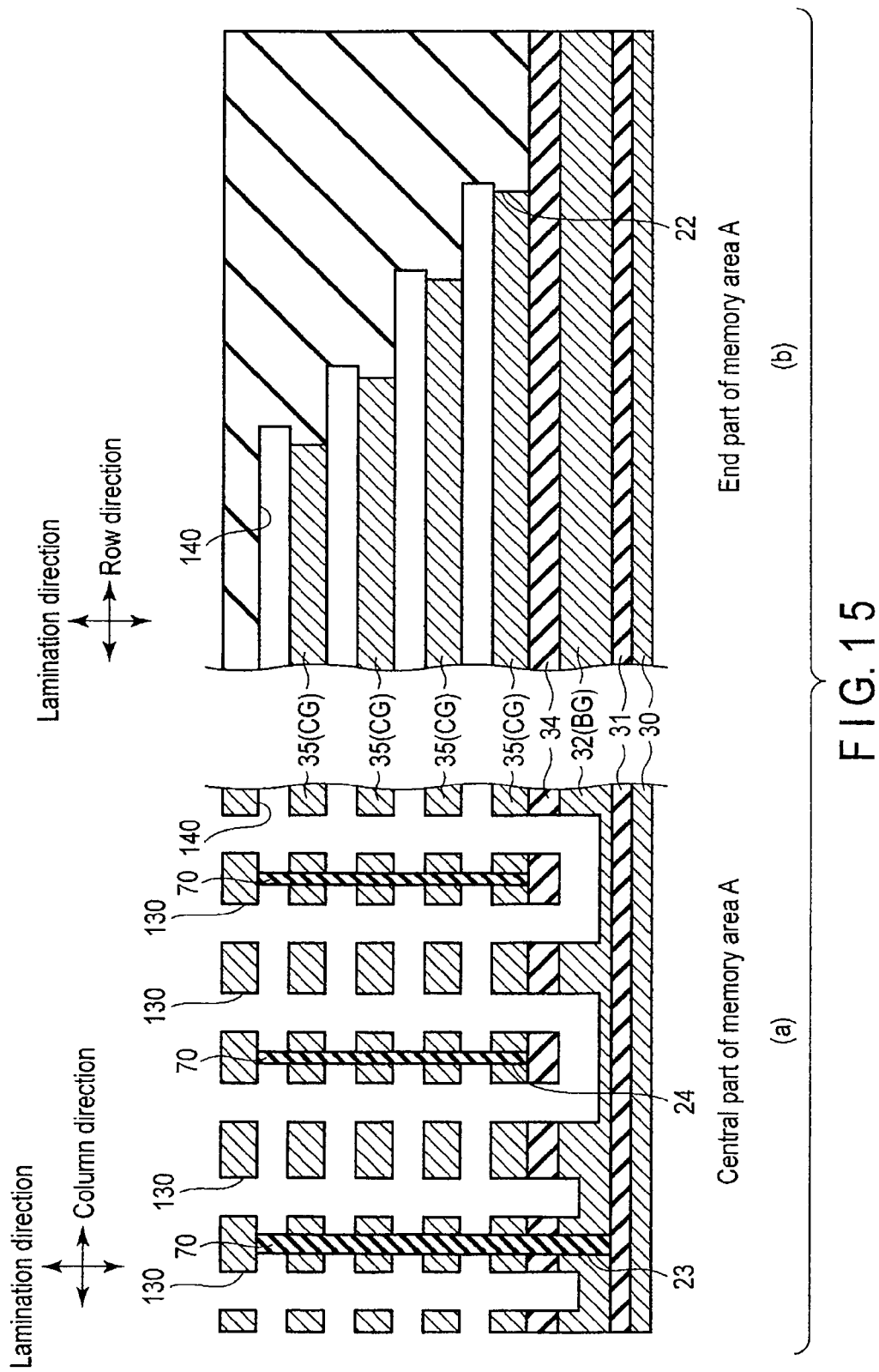
F I G. 15

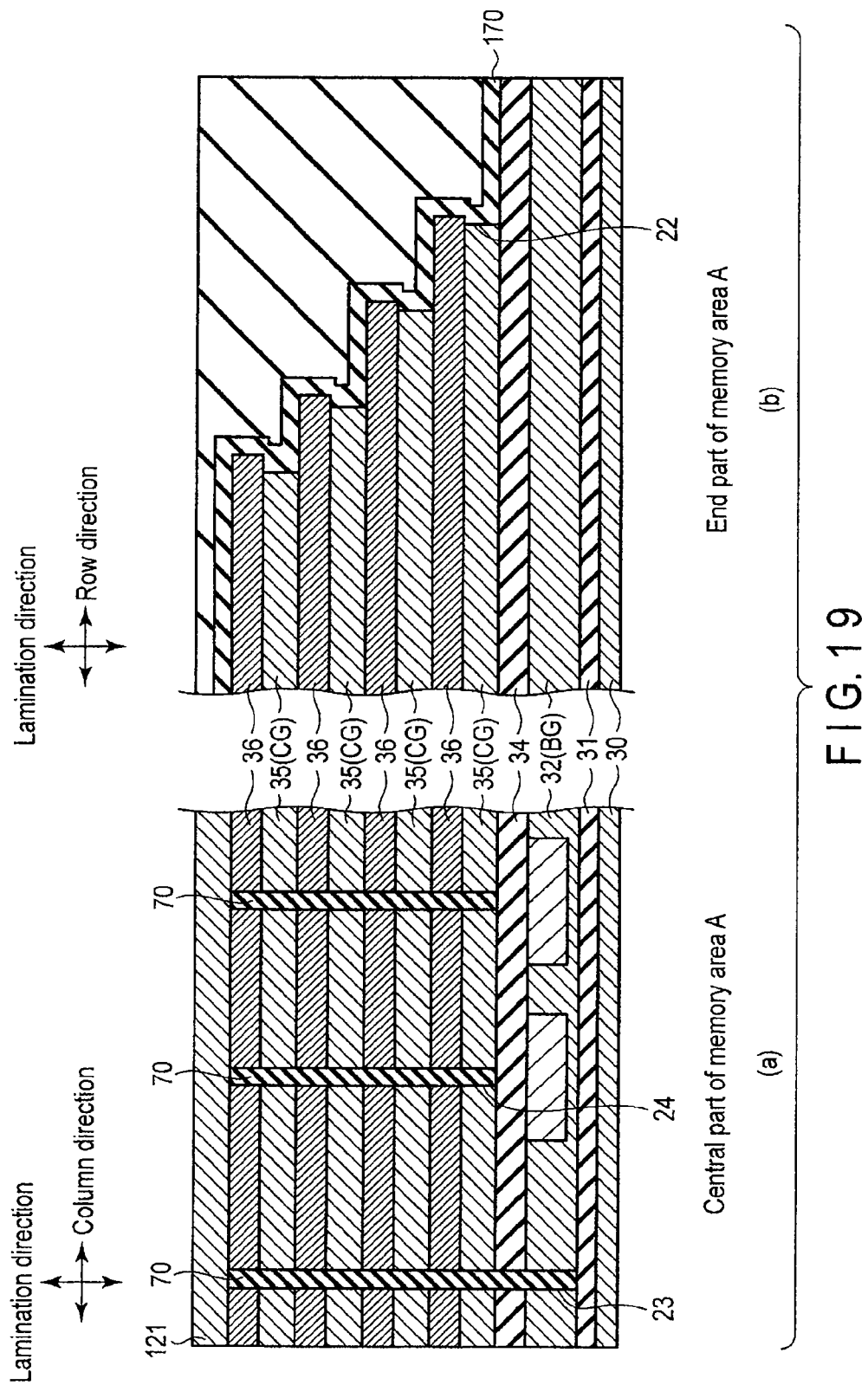
F I G. 19

SEMICONDUCTOR MEMORY DEVICE AND METHOD OF MANUFACTURING THE SAME

CROSS-REFERENCE TO RELATED APPLICATIONS

This application is based upon and claims the benefit of priority from prior Japanese Patent Application No. 2011-197255, filed Sep. 9, 2011, the entire contents of which are incorporated herein by reference.

FIELD

Embodiments described herein relate generally to a semiconductor memory device, and method of manufacturing the same.

BACKGROUND

In a laminated memory, an end of a laminated electrode is shaped into a step-like form in order to obtain contact with a laminated electrode in some cases. Heretofore, in order to shape an end of a laminated electrode into a step-like form, resist slimming and reactive ion etching (RIE) of each electrode layer have been alternately carried out repeatedly.

However, resist slimming and RIE of the laminated electrode are different from each other in the type of reactive gas used for etching. Accordingly, the higher the number of laminations, the higher the number of gas replacements, thus the etching time becomes longer. This makes the processing time longer, and reduction in throughput becomes a problem.

BRIEF DESCRIPTION OF THE DRAWINGS

FIG. 3 is a cross-sectional view obtained by enlarging the NAND string in FIG. 2.

FIG. 5 is a cross-sectional view showing the semiconductor memory device according to the first embodiment.

FIG. 12 is a cross-sectional view showing the manufacturing process of the semiconductor memory device according to the first embodiment subsequent to FIG. 11.

FIG. 15 is a cross-sectional view showing the manufacturing process of the semiconductor memory device according to the first embodiment subsequent to FIG. 14.

FIG. 19 is a cross-sectional view showing a manufacturing process of the semiconductor memory device according to the second embodiment.

DETAILED DESCRIPTION

Figure 1:
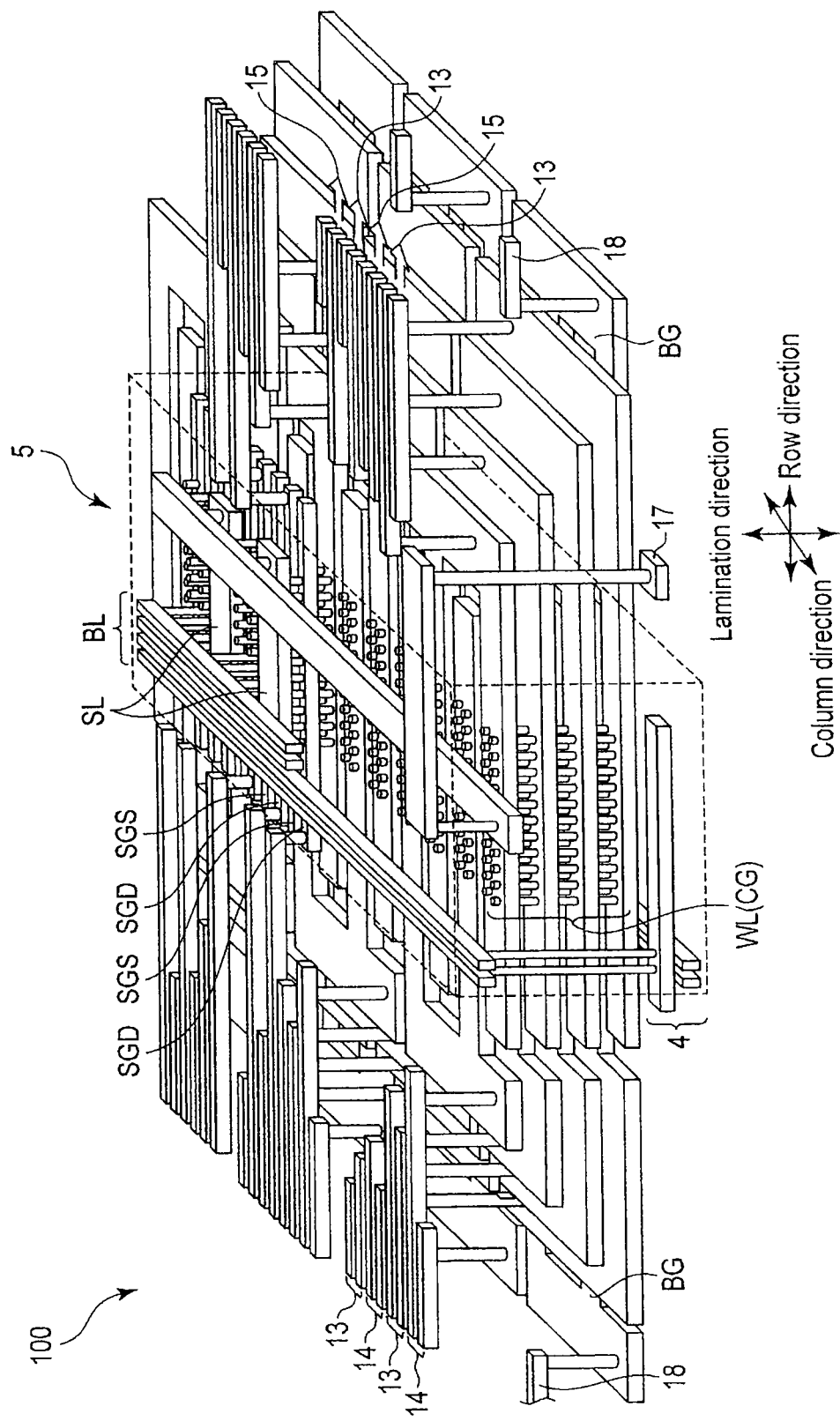
FIG. 1 is a perspective view showing an example of the overall configuration of a semiconductor memory device according to each embodiment.

In general, according to one embodiment, there is provided a method of manufacturing a semiconductor memory device. In the semiconductor memory device, on a substrate, a laminated body in which a first silicon layer having an impurity concentration of a first concentration, first sacrificial layer having an impurity concentration of a second concentration lower than the first concentration, second silicon layer having the impurity concentration of the first concentration, and second sacrificial layer having the impurity concentration of the second concentration are laminated in turn is formed. A first insulating film is formed on the laminated body. A trench is formed in the laminated body and first insulating film. A third sacrificial layer having the impurity concentration of a third concentration lower than the first concentration, and higher than the second concentration is filled into the trench. The third sacrificial layer in the trench is etched by wet etching to be retreated from a top surface of the third sacrificial layer, thereby etching the end faces of the first sacrificial layer and second sacrificial layer exposed to the inside of the trench. End faces of the first silicon layer and second silicon layer exposed to the inside of the trench are etched along the end faces of the first sacrificial layer and second sacrificial layer. After the etching of the first silicon layer and second silicon layer, the first insulating film is removed. After the removal of the first insulating film, a second insulating film is filled into the trench to cover the whole surfaces of the first sacrificial layer, second sacrificial layer, first silicon layer, and second silicon layer. By removing the first sacrificial layer, and second sacrificial layer, a gap is formed between the first silicon layer, second silicon layer, and second insulating film. A third insulating film is filled into the gaps. A first contact connected to the first silicon layer and second contact connected to the second silicon layer are formed.

This embodiment will be described below with reference to the drawings. In the drawings, parts identical to each other are denoted by identical reference symbols.

<Overall Configuration Example>

An overall configuration example of a semiconductor memory device according to each embodiment will be described below by using FIGS. 1, 2 and 3.

FIG. 1 is a perspective view showing an overall configuration example of a semiconductor memory device according to each embodiment.

As shown in FIG. 1, the semiconductor memory device 100 is provided with a memory cell array 5, a plurality of word line drive circuits 13, a plurality of source side selection gate line drive circuits 14, a plurality of drain side selection gate line drive circuits 15, a sense amplifier 4, a plurality of source line drive circuits 17, a plurality of back gate transistor drive circuits 18, and the like.

In the memory cell array 5, a plurality of word lines WL (control gates CG), a plurality of bit lines BL, a plurality of source lines SL, a plurality of back gates BG, a plurality of source side selection gates SGS, and a plurality of drain side selection gates SGD are provided. In the memory cell array 5, at each of intersection positions of the plurality of laminated word lines WL, and U-shaped silicon pillar SP to be described later, a memory cell transistor MTr configured to store therein data is arranged. Further, although details will be described later, end parts of the plurality of laminated word lines are formed stepwise, and a contact is connected to a top surface of each step. It should be noted that in FIG. 1, although an example in which four layers of word lines WL are laminated is shown, the example is not limited to this.

The word line drive circuit 13 is connected to a word line WL, and controls a voltage applied to the word line WL. Further, although all the wirings connecting the word line drive circuits 13 and word lines WL to each other are formed in a wiring layer of the same level, the wirings are not limited to the above, and may be formed in a wiring layer of a different level.

The source side selection gate line drive circuit 14 is connected to a source side selection gate SGS, and controls a voltage applied to the source side selection gate SGS.

The drain side selection gate drive circuit 15 is connected to a drain side selection gate SGD, and controls a voltage applied to the drain side selection gate SGD.

The sense amplifier 4 is connected to a bit line BL, and amplifies a potential read from the memory cell transistor MTr. Further, a bit line drive circuit (not shown) controls a voltage applied to the bit line BL.

The source line drive circuit 17 is connected to a source line SL, and controls a voltage applied to the source line SL. Although the source line drive circuits 17 are connected to all the source lines SL, the connection is not limited to this, and each of the source line drive circuits 17 may also be provided for each source line SL.

The back gate transistor drive circuit 18 is connected to a back gate BG, and controls a voltage applied to the back gate BG.

Figure 2:
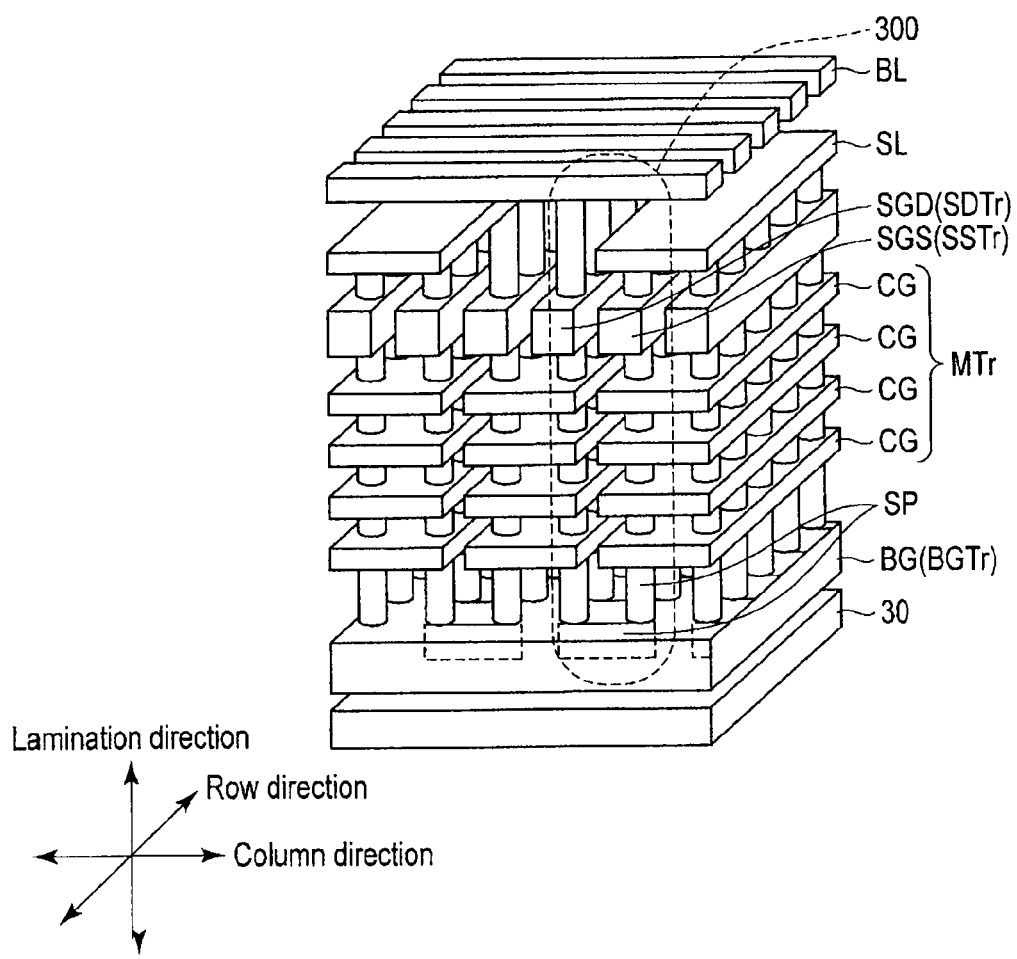
FIG. 2 is a perspective view showing a memory cell array in FIG. 1.

FIG. 2 is a perspective view showing the memory cell array in FIG. 1, and shows the structure of a NAND string (memory cell string) 300. FIG. 3 is a cross-sectional view obtained by enlarging the NAND string 300 in FIG. 2.

As shown in FIG. 2, in the memory cell array 5, a plurality of NAND strings (memory cell strings)) 300 each constituted of U-shaped silicon pillars SP are arranged on a semiconductor substrate 30. Each memory string 300 includes a plurality of memory cell transistors MTr current paths of which are formed in series along the U-shaped silicon pillar SP, and two selection transistors (drain side selection transistor SDTr, and source side selection transistor SSTr) each formed at both ends of the silicon pillar SP.

The plurality of memory cell transistors MTr are formed at intersection positions of the U-shaped silicon pillars SP and the plurality of control gates CG, and their current paths are connected in series in the lamination direction. Further, as shown in FIG. 3, each memory cell transistor MTr includes a memory film 155 between the U-shaped silicon pillar SP and control gate CG. The memory film 155 is constituted of a tunnel insulating film 152, charge storage layer 151, and block insulating film 150 which are formed in the order mentioned around the U-shaped silicon pillar SP. That is, each memory cell transistor MTr is constituted of the U-shaped silicon pillar SP, tunnel insulating film 152, charge storage layer 151, block insulating film 150, and control gate CG which are formed around the silicon pillar SP.

The drain side selection transistor SDTr is formed at an intersection position of the U-shaped silicon pillar SP and drain side selection gate SGD. On the other hand, the source side selection transistor SSTr is formed at an intersection position of the U-shaped silicon pillar SP and source side selection gate SGS.

Further, as shown in FIG. 2, the drain side selection transistor SDTr, and source side selection transistor SSTr are formed above the plurality of memory cell transistors MTr. Further, in the source side selection transistor SSTr, one end (drain) thereof is connected to one end (source) of each of the plurality of memory cell transistors, and the other end (source) thereof is connected to the source line SL. On the other hand, in the drain side selection transistor SDTr, one end (source) thereof is connected to the other end (drain) of each of the plurality of memory cell transistors MTr, and the other end (drain) thereof is connected to the bit line BL.

The U-shaped silicon pillar SP is formed into a U-shape in the cross section in the column direction. The U-shaped silicon pillar SP includes a pair of pillar-shaped sections extending in the lamination direction, and a pipe section formed to couple lower ends of the pair of pillar-shaped sections to each other. The pipe section is provided in the back gate BG, and constitutes a back gate transistor BGTr. Further, the U-shaped silicon pillar SP is arranged in such a manner that a straight line connecting the central axes of the pair of pillar-shaped sections is in the column direction. Further, the U-shaped silicon pillars SP are arranged in a matrix form in a plane extending in the row direction and column direction. Furthermore, as shown in FIG. 3, the U-shaped silicon pillar SP includes a hollow H1, and the hollow H1 may be filled with an insulating section 156.

The plurality of control gates CG are laminated above the back gates BG, and are arranged to be perpendicular to the pillar-shaped sections of the U-shaped silicon pillar SP. Each control gate CG extends in the row direction. Further, each control gate may be formed in such a manner that each control gate is shared by two adjacent pillar-shaped sections (two pillar-shaped sections on the center side) of four pillar-shaped sections of two memory cell strings 300 adjacent to each other in the column direction.

The back gate BG is provided below the lowermost control gate CG. The back gate BG is formed to extend two-dimensionally in the row direction and column direction so that the coupling section of the U-shaped silicon pillar SP is covered.

The drain side selection gate SGD, and source side selection gate SGS are provided above the uppermost control gate CG. The drain side selection gate SGD, and source side selection gate SGS extend in parallel with each other in the row direction. Further the drain side selection gate SGD is formed to be perpendicular to one of the pillar-shaped sections of the U-shaped silicon pillar SP, and the source side selection gate SGS is formed to be perpendicular to the other of the pillar-shaped sections. The drain side selection gate SGD, and source side selection gate SGS are formed to be insulation-isolated from each other in the column direction on a line-and-space basis.

The source line SL is provided above the source side selection gate SGS. The source line SL is formed in such a manner that the source line is shared by two adjacent pillar-shaped sections of four pillar-shaped sections of two memory cell strings 300 adjacent to each other in the column direction. The source lines SL extend in parallel with each other in the row direction, and are formed to be insulation-isolated from each other in the column direction on a line-and-space basis.

The plurality of bit lines BL are provided above the source lines SL. The bit lines BL extend in parallel with each other in the column direction, and are formed to be insulation-isolated from each other in the row direction on a line-and-space basis.

First Embodiment

A semiconductor memory device according to a first embodiment will be described below by using FIGS. 4, 5, 6, 7, 8, 9, 10, 11, 12, 13, 14, 15, 16 and 17. The first embodiment is an example of a manufacturing method, in which a boron-doped silicon layer which becomes a control gate CG, and non-doped silicon layer which is a sacrificial layer are laminated, thereafter an end part of the sacrificial layer is formed into a step-like structure by wet etching, and an end part of the control gate CG is formed into a step-like structure along the step-like shape of the sacrificial layer.

[Structure].

The structure of the semiconductor memory device according to the first embodiment will be described below by using FIGS. 4, 5 and 6.

Figure 4:
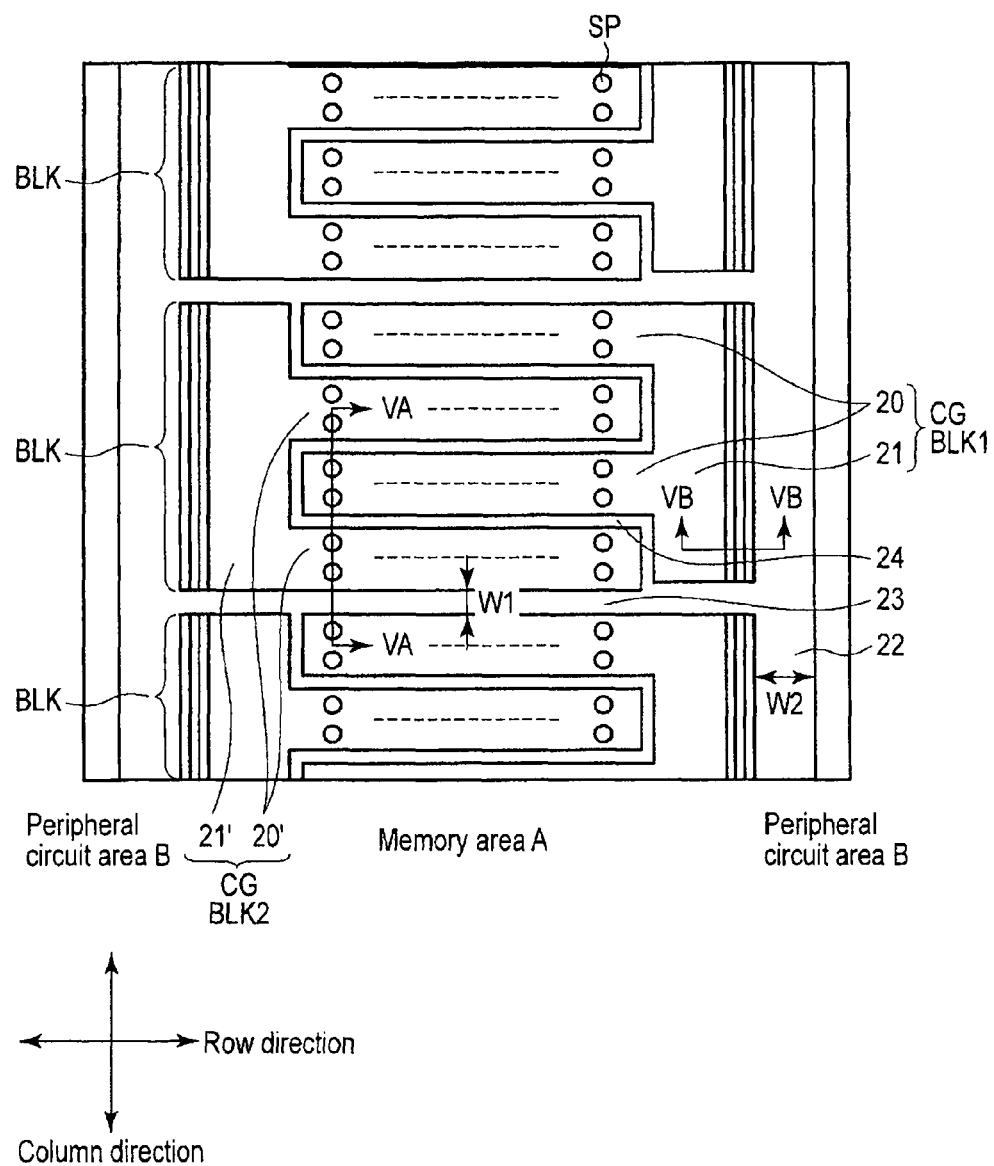
FIG. 4 is a plan view showing a semiconductor memory device according to a first embodiment.

FIG. 4 is a plan view showing the semiconductor memory device (particularly, the control gate CG) according to the first embodiment, and is a plan view showing a control gate block CGBLK according to the first embodiment. Here, the control gate block CGBLK shows a control gate CG in a block unit, and both of them are substantially identical to each other.

As shown in FIG. 4, the semiconductor memory device according to the first embodiment is constituted of a memory area A, and peripheral circuit areas B, and the memory area A is constituted of a plurality of blocks BLK arranged in the column direction.

Each block BLK is constituted of two control blocks CGBLK1 and CGBLK2. The control block CGBLK1 is constituted of two memory sections 20 in which memory cell transistors MTr are arranged, and connection section 21 connecting the two memory sections 20 to each other. The memory sections 20 extend in parallel with each other in the row direction. Further, the memory sections 20 are perpendicular to the U-shaped silicon pillars SP arranged in the matrix form, and extending in the lamination direction. The connection section 21 connects the two memory sections 20 to each other at their ends on one side in the row direction. The control block CGBLK2 is constituted of two memory sections 20' in which memory cell transistors MTr are arranged, and connection section 21' connecting the two memory sections 20' to each other. The memory sections 20' extend in parallel with each other in the row direction. Further, the memory sections 20' are perpendicular to the U-shaped silicon pillars SP arranged in the matrix form, and extending in the lamination direction. The connection section 21' connects the two memory sections 20' to each other at the other ends in the row direction.

That is, in each block BLK, the memory sections 20 and the memory sections 20' are alternately arranged in the column direction, the memory sections 20 are connected to the connection section 21 at their ends on one side in the row direction, and the memory sections 20' are connected to the connection section 21' at the other ends in the row direction. In other words, the even-numbered memory section 20 in the column direction is connected to the connection section 21 at one end thereof in the row direction, and the odd-numbered memory section 20' is connected to the connection section 21' at the other end thereof in the row direction. It should be noted that the number of the memory sections 20 or the memory sections 20' is not limited to two, and may be three or more.

Here, as shown in FIG. 4, a slit 23 extending in the row direction is formed between two blocks BLK adjacent to each other. In other words, the slits 23 divide the memory area A into a plurality of blocks BLK in the column direction. A width W1 of the slit 23 is, for example, 60 nm.

On the other hand, a trench 22 extending in the column direction is formed between the blocks BLK (memory area A) and peripheral circuit area B. In other words, the trench 22 separates the memory area A and peripheral circuit area B from each other. A width W2 of the trench 22 is, for example, 150 nm. That is, the width W2 of the trench 22 is greater than the width W1 of the slit 23. It should be noted that it is desirable that the width W2 of the trench 22 be greater than or equal to twice the width W1 of the slit 23, and smaller than or equal to ten times the width W1 of the slit 23.

It should be noted that a slit 24 is also formed between the memory section 20 and memory section 20' adjacent to each other in the column direction, and a width thereof is substantially identical to the width W1 of the slit 23. Details of a relationship between the width W1 and width W2 will be described later.

FIG. 5 is a cross-sectional view showing the semiconductor memory device according to the first embodiment. More specifically, FIG. 5(*a*) is a cross-sectional view taken along line VA-VA in FIG. 4, and FIG. 5(*b*) is a cross-sectional view taken along line VB-VB in FIG. 4. That is, FIG. 5(*a*) is a cross-sectional view of the memory sections 20 and 20' taken in the column direction, and FIG. 5(*b*) is a cross-sectional view of the connection section 21 (connection section 21') taken in the row direction. In other words, FIG. 5(*a*) is a cross-sectional view showing the central part of the memory area A, and FIG. 5(*b*) is a cross-sectional view showing the end part of the memory area A.

Figure 6:
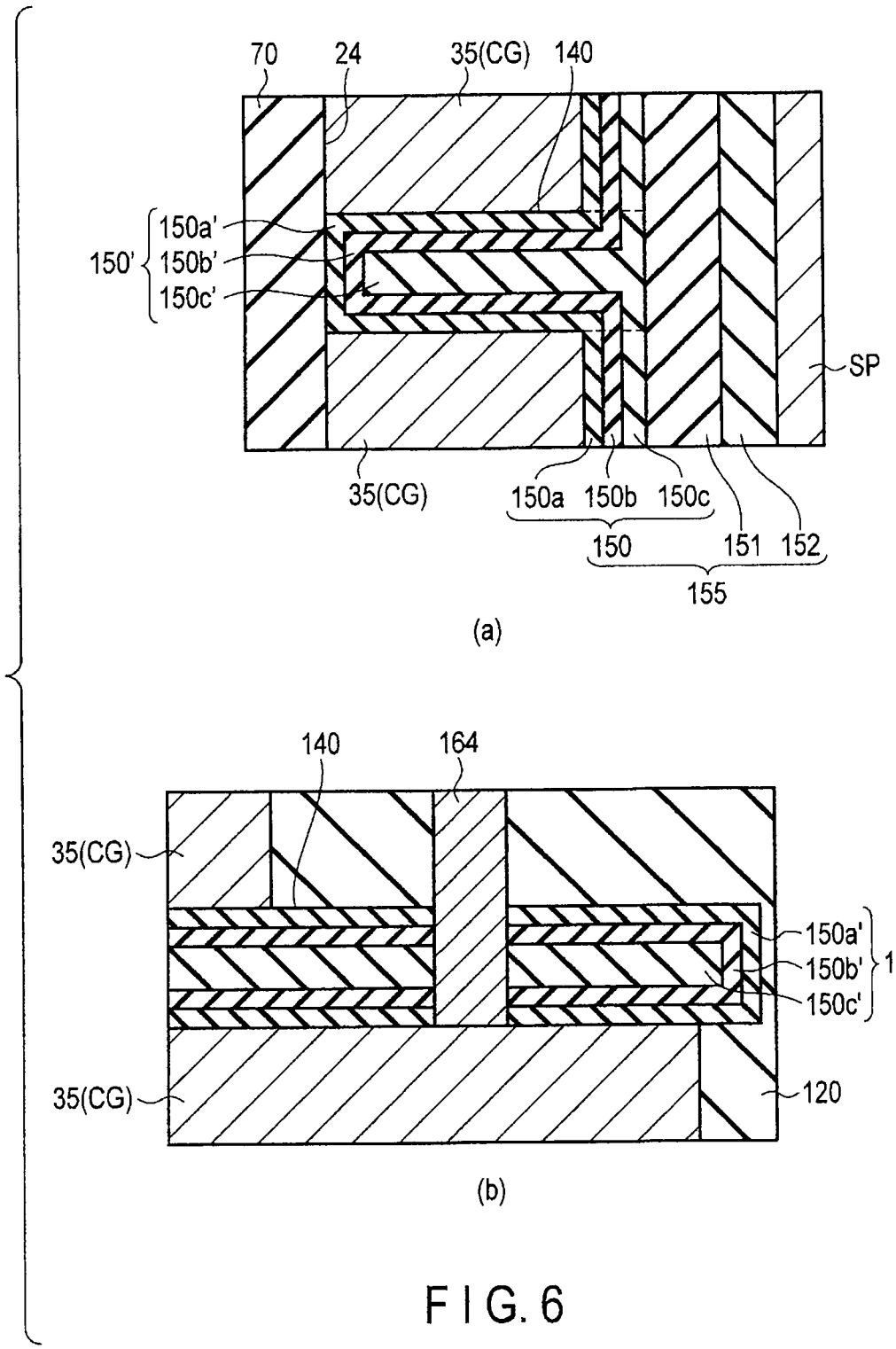
FIG. 6 is a cross-sectional view obtained by enlarging part of the semiconductor memory device in FIG. 5.

Further, FIG. 6 is a cross-sectional view obtained by enlarging part of the semiconductor memory device in FIG. 5. More specifically, FIG. 6(*a*) is a cross-sectional view obtained by enlarging part of the central part of the memory area A in FIG. 5(*a*), and FIG. 6(*b*) is a cross-sectional view obtained by enlarging part of the end part of the memory area A in FIG. 5(*b*).

It should be noted that here, when the memory sections 20, and 20', and the connection sections 21, and 21' are not particularly distinguished, they are simply referred to as control gate CG (word line WL).

As shown in FIG. 5(*a*), at the central part of the memory area A, a plurality of NAND strings 300 are arranged. Each NAND string 300 is provided with a conductive layer 32, doped silicon layers 35, and 121, inter-electrode insulating films 150', memory films 155, U-shaped silicon pillar SP, and insulating material 70, all of which are formed above the semiconductor substrate 30.

The conductive layer 32 is formed on the semiconductor substrate 30 through an insulating film 31, and is constituted of, for example, phosphorus-introduced polysilicon. The conductive layer 32 becomes the back gate BG, and the U-shaped silicon pillar SP and memory film 155 are formed inside the back gate BG, thereby constituting a back gate transistor BGTr.

The plurality of doped silicon layers 35, and the plurality of inter-electrode insulating films 150' are alternately laminated on the conductive layer 32 with the silicon oxide film 34 interposed between them. The doped silicon layer 35 becomes the control gate CG, and the U-shaped silicon pillar SP and memory film 155 are formed inside the control gate CG, thereby constituting the memory cell transistor MTr. That is, each inter-electrode insulating film 150' is formed between (gap 140) two control gates CG adjacent to each other in the lamination direction. A more detailed description of the doped silicon layer 35, and inter-electrode insulating film 150' will be given later.

The doped silicon layer 121 is formed on the control gate CG of the uppermost layer with an inter-electrode insulating film 150' interposed between them. The doped silicon layer 121 becomes the selection gate SG, and the U-shaped silicon pillar SP, and memory film 155 are formed inside the selection gate SG, thereby constituting the selection transistors SDTr, and SSTr.

Inside the selection gate SD, control gate CG, back gate BG, and inter-electrode insulating film 150', a U-shaped memory hole 130 is provided. The U-shaped memory hole 130 is constituted of a pair of through holes arranged in the column direction, and a coupling hole configured to couple the pair of through holes to each other. The through hole is formed to extend in the lamination direction inside the selection gate SG, and control gate CG, and the coupling hole is formed to extend in the column direction inside the back gate BG.

Further, inside the control gate CG, and inter-electrode insulating film 150', a slit 24 extending in the row direction, and lamination direction is provided between the pair of through holes of the U-shaped memory hole 130. Thereby, the control gate CG, and inter-electrode insulating film 150' are divided into parts in the row direction.

Further, inside the control gates CG, inter-electrode insulating films 150', silicon oxide film 34, and back gate BG at the end part of the block BLK, a slit 23 extending in the row direction, and lamination direction is provided. In other words, the block BLK is divided into parts in the row direction by the slit 23.

Furthermore, an opening section 180 extending in the row direction, and lamination direction is provided in the selection gate SG in order that the slit 23 and slit 24 can be opened. Thereby, the selection gate SG is divided into parts in the row direction.

The memory film 155 is formed on the inner surface of the U-shaped memory hole 130, i.e., on the surfaces of the selection gate SG, control gates CG, and back gate BG in the U-shaped memory hole. Further, although details will be described later, part of the memory film 155 is integral with the inter-electrode insulating film 150'.

The U-shaped silicon pillar SP is formed on the surface of the memory film 155 in the U-shaped memory hole 130, and is constituted of polysilicon containing therein impurities, such as phosphorus. That, is, the U-shaped silicon pillar SP is constituted of a pair of pillar-shaped sections formed on the surface of the memory film 155 in the pair of through holes, and a coupling section formed on the surface of the memory film 155 in the coupling hole. It should be noted that in FIG. 5(a), although an example in which polysilicon is filled into the inside of the U-shaped memory hole 130 as the U-shaped silicon pillar SP is shown, the U-shaped memory hole 130 may also have the hollow structure as shown in FIG. 3.

The insulating material 70 is filled into the slit 23, slit 24, and opening section 180. Owing to the presence of the insulating material 70, the control gates CG, and the selection gate SG divided into parts by the slits 23, and 24, and opening section 180 are insulation-isolated from each other.

It should be noted that although not shown, a silicide layer may be formed on the surface of the control gate CG in the slit 24, and on the surface of the selection gate SG in the opening section 180. In other words, the silicide layer is formed between each of the control gate CG and selection gate SG, and insulating material 70. Owing to the presence of the silicide layer, it is possible to make the resistance of each of the control gate CG, and selection gate SG lower, and improve the operating speed.

As shown in FIG. 6(a), the memory film 155 is constituted of a block insulating film 150 formed on the surface of the control gate CG in the through hole, charge storage layer 151 formed on the surface of the block insulating film 150, and tunnel insulating film 152 formed on the surface of the charge storage layer 151.

Here, the block insulating film 150 in this embodiment has a multilayer structure. More specifically, the block insulating film 150 has a multilayer structure constituted of a silicon oxide film 150a, silicon nitride film 150b, and silicon oxide film 150c which are formed in the order mentioned on the surface of the control gate CG in the through hole. That is, the block insulating film 150 has a structure in which the silicon nitride film and silicon oxide film are alternately laminated. It should be noted that the block insulating film 150 is not limited to the lamination of three layers.

The inter-electrode insulating film 150' is integral with the block insulating film 150, and has a multilayer structure. That is, the inter-electrode insulating film 150' has a multilayer structure constituted of a silicon oxide film 150'a, silicon nitride film 150'b, and silicon oxide film 150'c which are formed in the order mentioned on the inner surface (on the surface of the control gate CG, and the surface of the insulating material 70 in the gap 140) of the gap 140. In other words, the inter-electrode insulating film 150' has a structure formed by filling the block insulating film 150 into the gap 140 through the through hole. In the example shown in FIG. 6, when the silicon oxide film 150'c is formed, the gap 140 is filled up.

As described above, in the through hole, the outermost layer of the block insulating film 150 is the silicon oxide film 150a. Accordingly, in the gap 140, the outermost layer of the inter-electrode insulating film 150' is likewise the silicon oxide film 150'a. That is, the inter-electrode insulating film 150' has the laminated structure formed by laminating the silicon oxide film 150'a, silicon nitride film 150'b, and silicon oxide film 150'c in turn from the outer side of the gap 140 (from the insulating material 70 side, and from the doped silicon layer 35 side positioned above or below).

On the other hand, as shown in FIG. 5(b), at the end part (end part in the row direction) of the memory area A, the plurality of control gates CG (doped silicon layers 35) are formed stepwise, and a contact 164 is connected to a top surface of each control gate CG. In other words, an end face of any one of the control gates CG protrudes from an end face of a control gate CG positioned in the upper layer of the above particular control gate CG. That is, a contact is connected to a top surface of each control gate at the protruding end part thereof, and the contact is connected to the wiring 165 in the insulating film 160.

Further, as described above, the plurality of control gates CG, and the plurality of inter-electrode insulating films 150' are alternately laminated. In other words, each of the inter-electrode insulating layers 150' is formed between (gap 140) control gates CG adjacent to each other in the lamination direction. The plurality of inter-electrode insulating films 150' are formed stepwise. The silicon oxide film 120 is formed to cover the end faces and top surfaces of the plurality of control gates CG, and the plurality of inter-electrode insulating films 150'.

Here, in this embodiment, the end face of each inter-electrode insulating film 150' in the row direction is formed to protrude from the end face of a control gate CG formed immediately below the inter-electrode insulating film 150' in the row direction. In other words, the end face of each control gate CG in the row direction is retreated from the end face of an inter-electrode insulating film 150' formed immediately above the control gate CG in the row direction. Further, the end face of each control gate CG protrudes from the end face of an inter-electrode insulating film 150' positioned in the upper layer of the inter-electrode insulating film 150' formed immediately above the control gate CG.

Further, the end face of each inter-electrode insulating film 150' in the row direction further protrudes from the upper side toward the lower side. In other words, the end face of each inter-electrode insulating film 150' is formed into a sloped shape extending from the upper side toward the lower side. More specifically, the end face of each inter-electrode insulating film 150' in the row direction extends from the upper side toward the lower side curvilinearly and continuously. Likewise, the end face of each control gate CG in the row direction is also formed into a sloped shape extending from the upper side toward the lower side. More specifically, the end face of each control gate CG in the row direction extends from the upper side toward the lower side curvilinearly and continuously.

As shown in FIG. 6(*b*), the inter-electrode insulating film 150' at the end part of the memory area A is integral with the block insulating film 150 as in the case of the inter-electrode insulating film 150' at the central part of the memory area A. That is, the inter-electrode insulating film 150' has a multilayer structure constituted of the silicon oxide film 150'*a*, silicon nitride film 150'*b*, and silicon oxide film 150'*c* which are formed in the order mentioned on the inner surface (on the surface of the control gate CG, and the surface of the silicon oxide film 120 in the gap 140) of the gap 140. In other words, the inter-electrode insulating film 150' has a structure formed by filling the block insulating film 150 into the gap 140 through the through hole.

As described above, in the through hole, the outermost layer of the block insulating film 150 is the silicon oxide film 150*a*. Accordingly, in the gap 140, the outermost layer (farthermost surface, uppermost surface or lowermost surface) of the inter-electrode insulating film 150' is likewise the silicon oxide film 150'*a*. That is, the inter-electrode insulating film 150' has the laminated structure formed by laminating the silicon oxide film 150'*a*, silicon nitride film 150'*b*, and silicon oxide film 150'*c* in turn from the outer-side of the gap 140 (from the silicon oxide film 120 side, and from the control gate CG side positioned above or below). In other words, the inter-electrode insulating film 150' is formed in such a manner that at the end face, top surface, and undersurface thereof, the outermost layer thereof, i.e., the silicon oxide film 150' is in contact with the silicon oxide film 120, and control gates CG positioned above and below.

The structure in which the inter-electrode insulating film 150' is constituted of a laminated film in which lamination is started from the outermost layer as described above is formed by the manufacturing process to be described later.

[Manufacturing Method]

Hereinafter, a method of manufacturing the semiconductor memory device according to the first embodiment will be described by using FIGS. 7, 8, 9, 10, 11, 12, 13, 14, 15, 16 and 17. FIGS. 7, 8, 9, 10, 11, 12, 13, 14, 15, 16 and 17 are cross-sectional views showing the manufacturing process of the semiconductor memory device according to the first embodiment. More specifically, FIGS. 7(*a*), 8(*a*), 9(*a*), 10(*a*), 11(*a*), 12(*a*), 13(*a*), 14(*a*), 15(*a*), 16(*a*) and 17(*a*) are cross-sectional views showing the manufacturing process at the central part of the memory area A, and FIGS. 7(*b*), 8(*b*), 9(*b*), 10(*b*), 11(*b*), 12(*b*), 13(*b*), 14(*b*), 15(*b*), 16(*b*) and 17(*b*) are cross-sectional views showing the manufacturing process at the end part of the memory area A.

Figure 7:
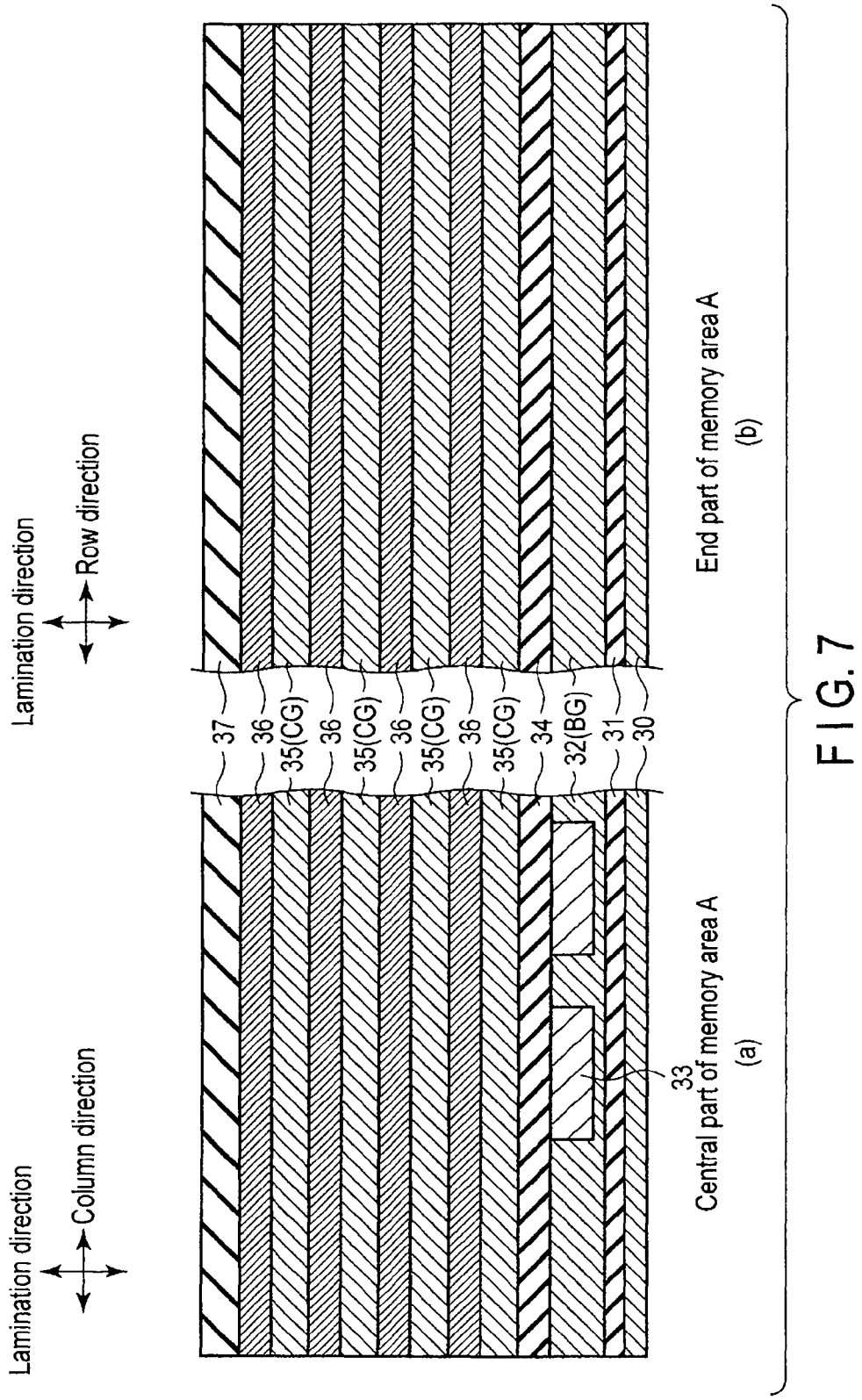
FIG. 7 is a cross-sectional view showing a manufacturing process of the semiconductor memory device according to the first embodiment.

First, as shown in FIG. 7(*a*) and FIG. 7(*b*), a conductive layer 32 which becomes the back gate BG is formed on a semiconductor substrate 30 through an insulating film 31. At this time, as shown in FIG. 7(*a*), at the central part of the memory area A, sacrificial layers 33 constituted of non-doped polysilicon are formed in part of the surface of the conductive layer 32. Thereafter, a silicon oxide film 34 is formed on the sacrificial layers 33 and conductive layer 32 as an insulating film.

Next, a laminated film obtained by alternately laminating doped silicon layers 35, which become the control gates CG, and into which boron of a high concentration is introduced, and non-doped silicon layers 36 which become sacrificial layers, and into which no impurities are introduced is formed on the silicon oxide film 34. The doped silicon layer 35 and the non-doped silicon layer 36 are each constituted of, for example, polysilicon or amorphous silicon. Further, polysilicon having a concentration of, for example, about $1 \times 10^{21}$ cm$^{-3}$ is introduced into the doped silicon layer 35.

Furthermore, on the uppermost non-doped silicon layer 36, a boron-added silicon oxide film 37 is formed. Boron of an appropriate concentration is added to the boron-added silicon oxide film 37. Accordingly, the boron-added silicon oxide film 37 has an etching selectivity different from a silicon oxide film which is formed before or after this process, and to which boron is not added.

Figure 8:
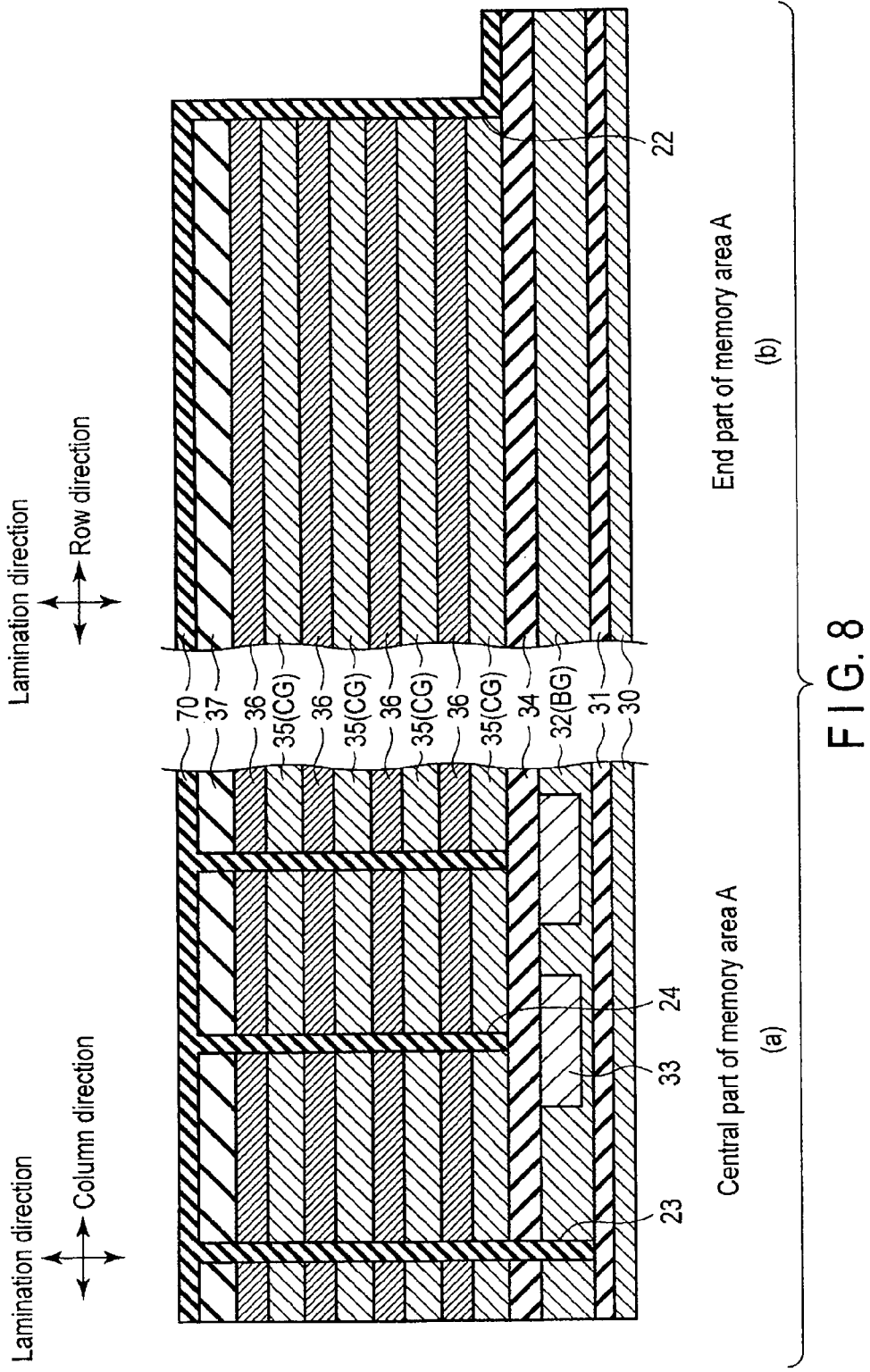
FIG. 8 is a cross-sectional view showing the manufacturing process of the semiconductor memory device according to the first embodiment subsequent to FIG. 7.
Figure 9:
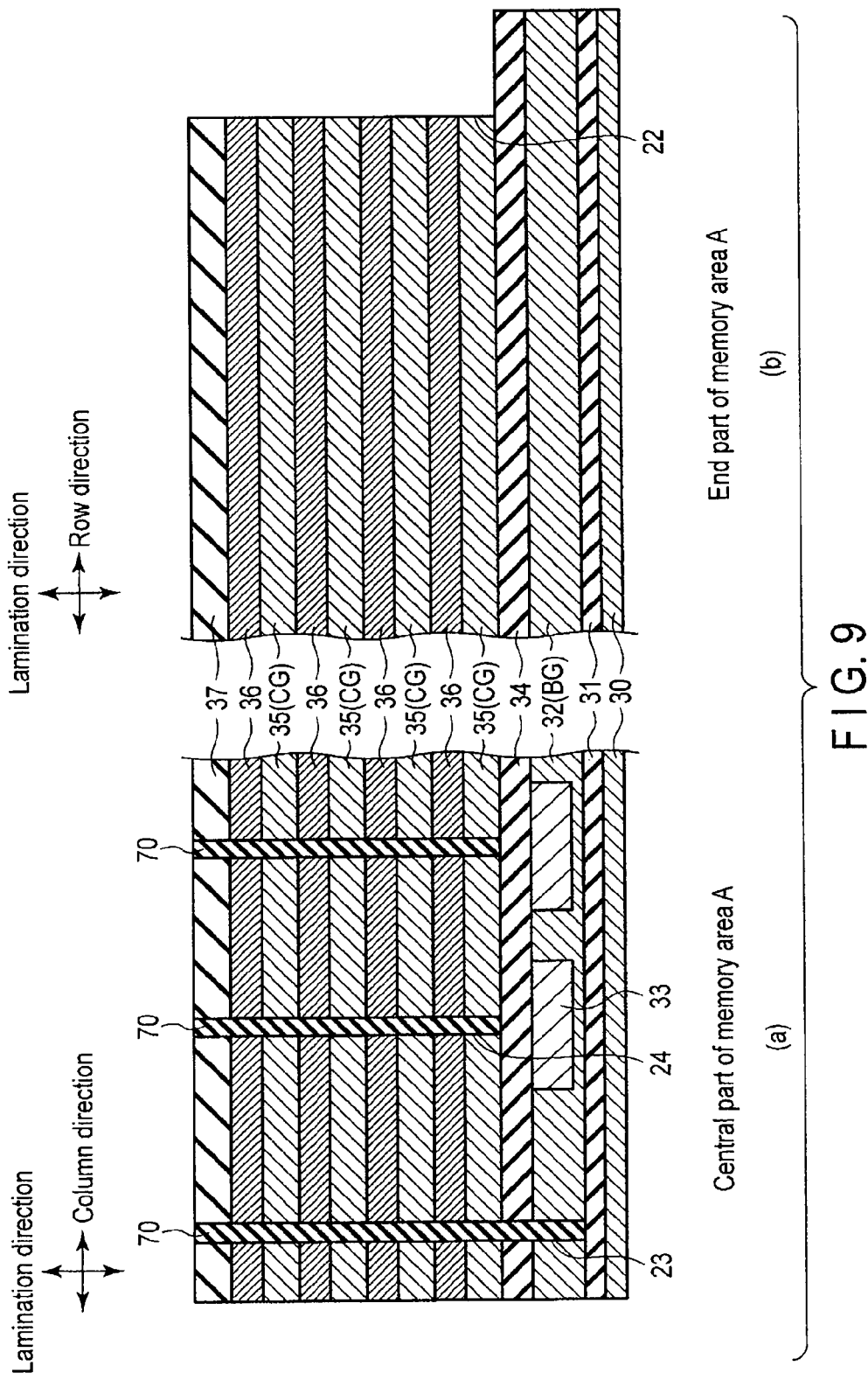
FIG. 9 is a cross-sectional view showing the manufacturing process of the semiconductor memory device according to the first embodiment subsequent to FIG. 8.
Figure 10:
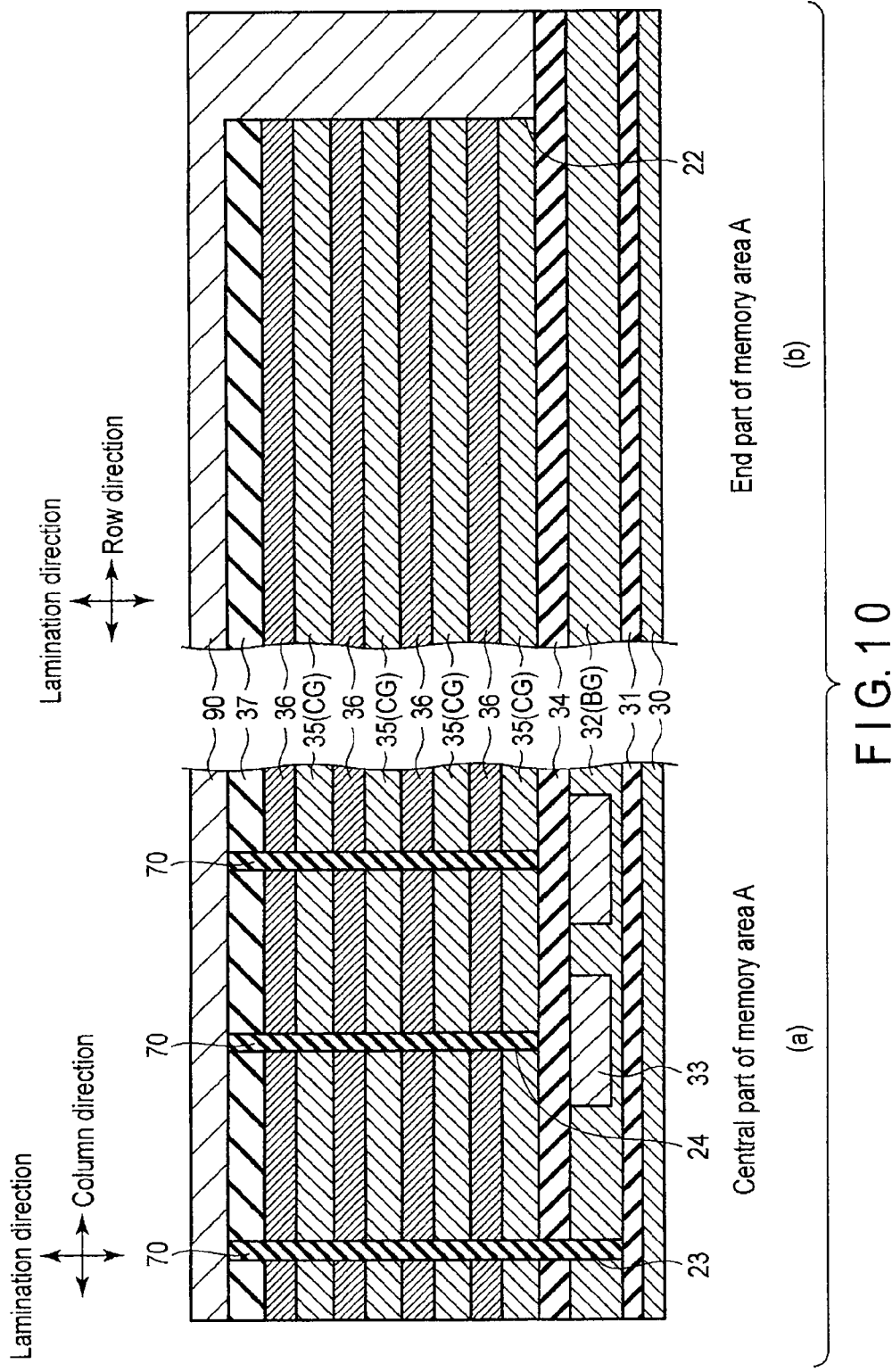
FIG. 10 is a cross-sectional view showing the manufacturing process of the semiconductor memory device according to the first embodiment subsequent to FIG. 9.
Figure 11:
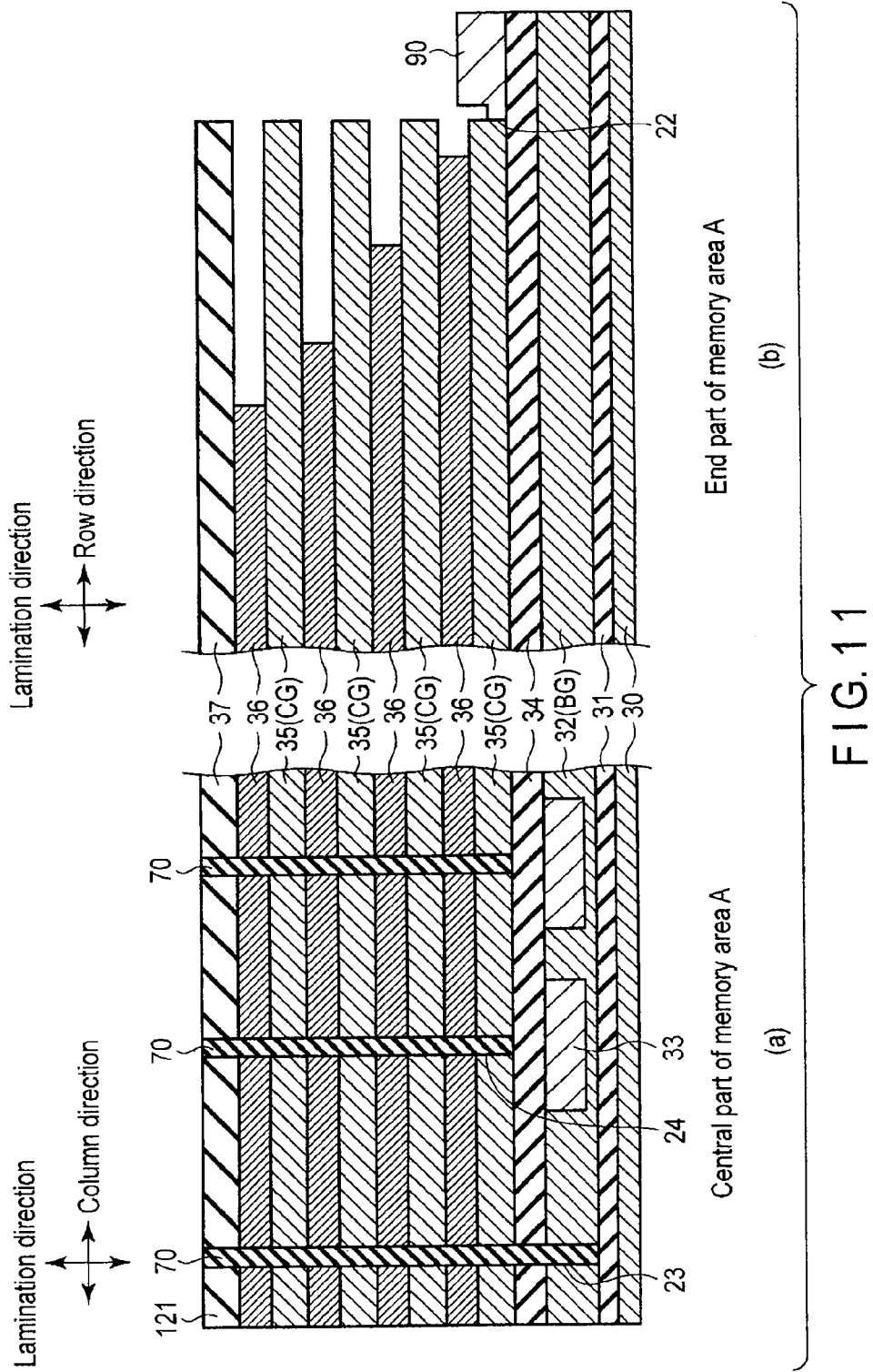
FIG. 11 is a cross-sectional view showing the manufacturing process of the semiconductor memory device according to the first embodiment subsequent to FIG. 10.
Figure 13:
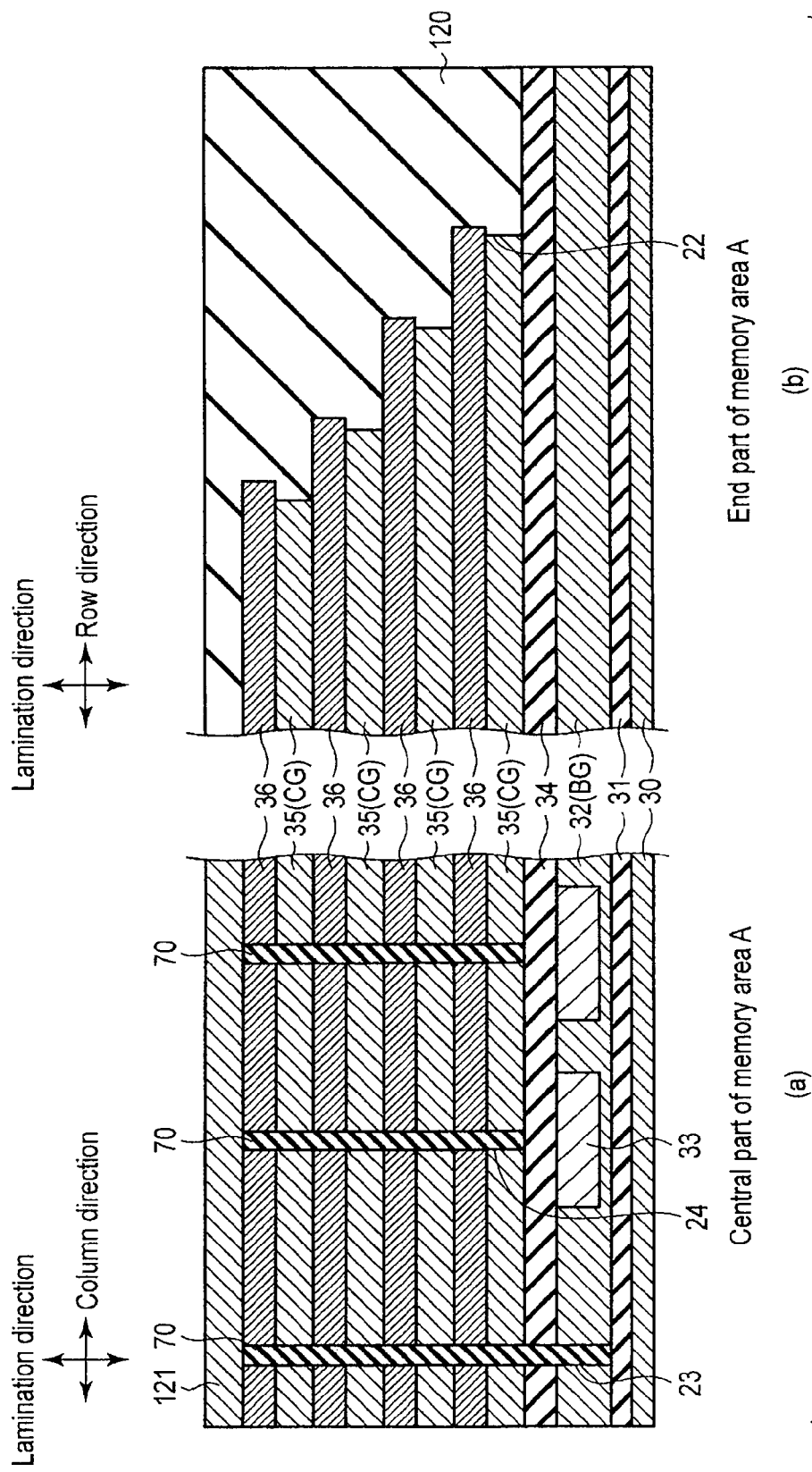
FIG. 13 is a cross-sectional view showing the manufacturing process of the semiconductor memory device according to the first embodiment subsequent to FIG. 12.
Figure 14:
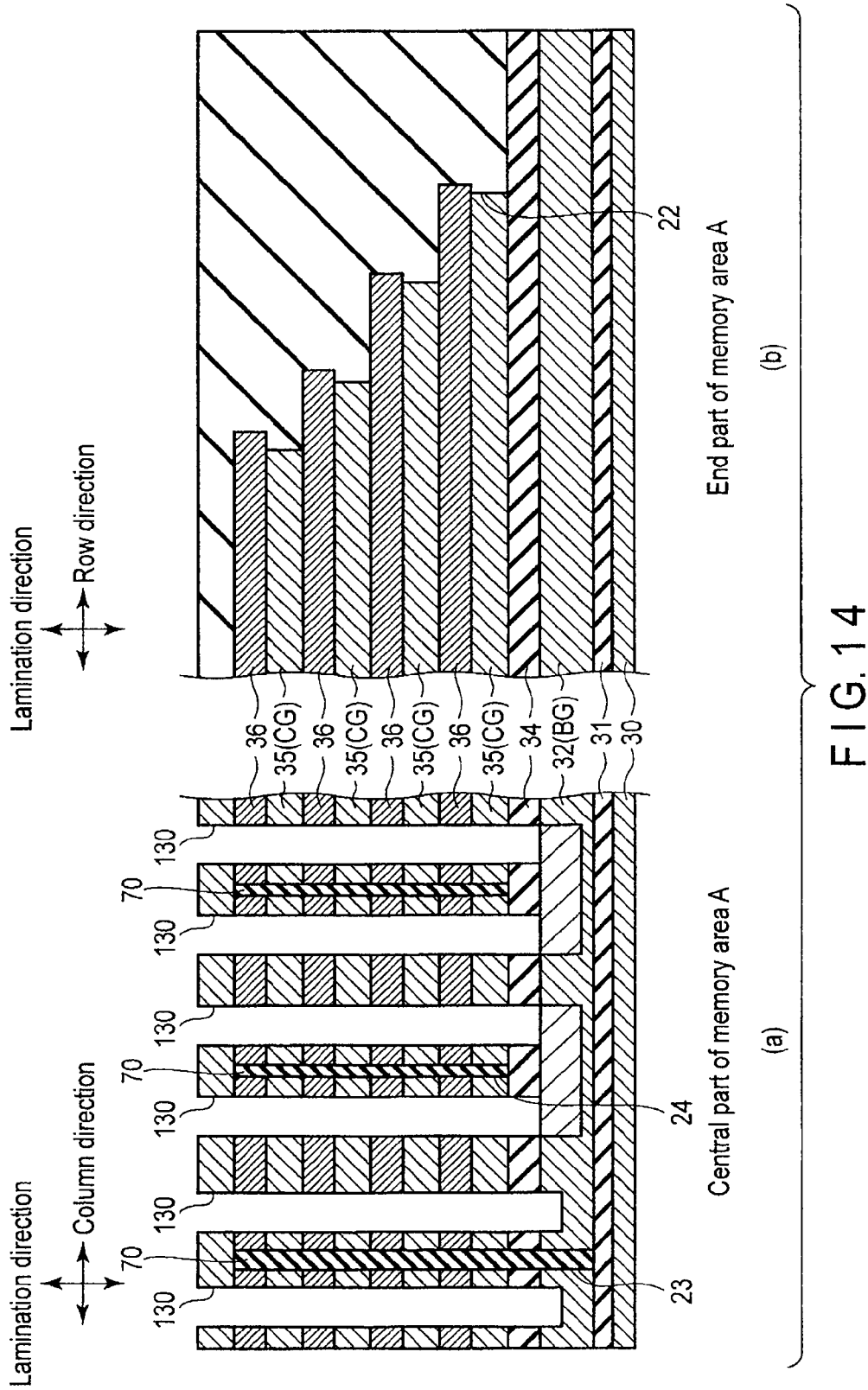
FIG. 14 is a cross-sectional view showing the manufacturing process of the semiconductor memory device according to the first embodiment subsequent to FIG. 13.
Figure 16:
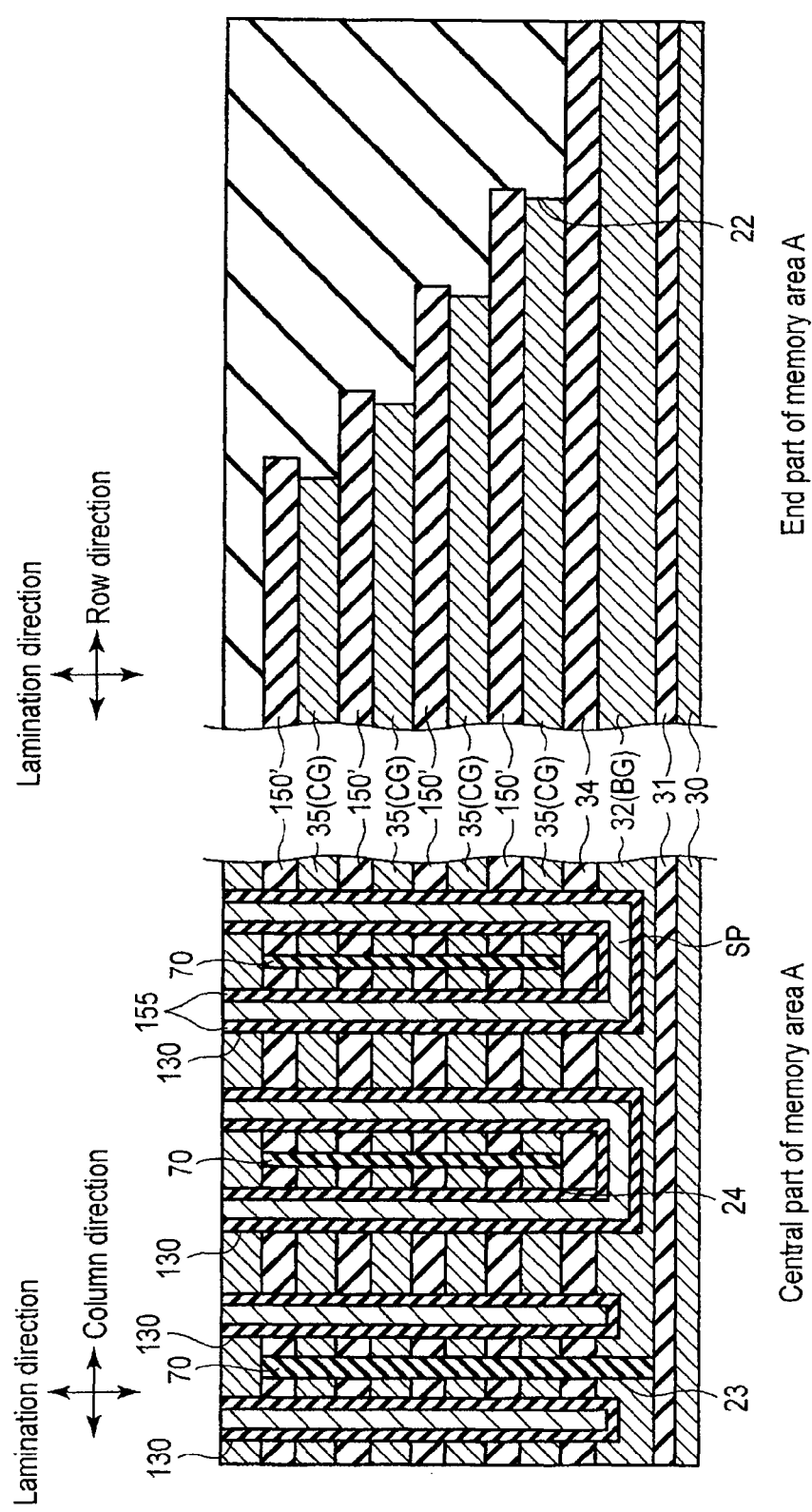
FIG. 16 is a cross-sectional view showing the manufacturing process of the semiconductor memory device according to the first embodiment subsequent to FIG. 15.

Next, as shown in FIG. 8(*a*), at the central part of the memory area A, in the boron-added silicon oxide film 37, non-doped silicon layers 36, and doped silicon layers 35, a slit 24 dividing the above film and layers into parts is formed by photolithography and reactive ion etching (RIE). Further, at the same time, in the boron-added silicon oxide film 37, non-doped silicon layers 36, doped silicon layers 35, silicon oxide film 34, and conductive layer 32, a slit 23 dividing these films and layers into parts is formed.

These slits 23 and 24 are formed in the row direction (in the backward direction of the page in FIG. 8). The slit is configured to divide the block BLK. Further, the slit 24 is configured to divide the control gates CG of the NAND string 300, and is formed at the central part of the sacrificial layer 33 in the column direction. Further, as shown in FIG. 4, the width of the slit 23 or 24 is, for example, about 60 nm.

At the same time, as shown in FIG. 8(*b*), at the end part of the memory area A, in the boron-added silicon oxide film 37, non-doped silicon layers 36, and doped silicon layers 35, a trench dividing the film, and layer is formed. The trench 22 is formed in the row direction. The trench 22 is configured to divide the memory area, and peripheral circuit area B from each other. Further, as shown in FIG. 4, the width W2 of the trench 22 is, for example, about 150 nm, and is greater than the width W1 of the slit 23 or 24. It should be noted that it is desirable that the width W2 of the trench 22 be greater than or equal to twice the width W1 of the slit 23 or 24, and smaller than or equal to ten times the width W1 of the slit 23 or 24.

Next, a silicon nitride film (insulating material) 70 is formed on the whole surface by low pressure chemical vapor deposition (LPCVD). That is, the silicon nitride film 70 is formed on the inner surfaces of the slits 23, and 24, inner surface of the trench 22, and on the boron-added silicon oxide film 37. Here, it is assumed that the film thickness of the silicon nitride film 70 to be formed is, for example, 60 nm. At this time, as described above, by making the width W1 of the slit 23 or 24 about 60 nm, and making the width W2 of the trench 22 about 150 nm, the slits 23 and 24 are completely filled with the silicon nitride film 70, whereas the trench 22 is not completely filled up.

Next, as shown in FIG. 9(a) and FIG. 9(b), at the central part of the memory area A, and at the end part of the memory area A, the silicon nitride film 70 is removed by isotropic etching, such as wet etching using a hot phosphoric acid solution or chemical dry etching (CDE). At this time, by carrying out isotropic etching, it is possible to remove the silicon nitride film 70 in the trench 22 and on the boron-added silicon oxide film 37, and leave the silicon nitride film 70 in the slits 23 and 24 unremoved.

Next, as shown in FIG. 10(a) and FIG. 10(b), a boron-doped silicon layer 90 which becomes the sacrificial layer, and has a medium concentration, and into which boron is introduced is formed on the whole surface. That is, the boron-doped silicon layer 90 is formed on the inner surface of the trench 22, and on the boron-added silicon oxide film 37. The doped silicon layer 90 is constituted of, for example, polysilicon or amorphous silicon. Here, the film thickness of the doped silicon layer 90 to be formed is, for example, 150 nm. Thereby, the trench 22 is completely filled with the doped silicon layer 90. In other words, at the end part of the memory area A, the end face of the laminated film in which the doped silicon layers 35, and the non-doped silicon layers 36 are alternately laminated is covered with the boron-doped silicon layer 90.

Here, boron of a concentration lower than the doped silicon layer 35, and higher than the non-doped silicon layer 36, i.e., boron of a concentration of, for example, about $1 \times 10^{20}$ cm$^{-3}$ is introduced into the doped silicon layer 90. The boron concentration of the doped silicon layer 90 is determined from the wet etching rate of the subsequent step. By adjusting the boron concentration, it is possible to control the retreat amount of the end part of the non-doped silicon layer 36 to be described later.

Next, as shown in FIG. 11(a) and FIG. 11(b), at the central part of the memory area A, and at the end part of the memory area A, the doped silicon layer 90 is removed by isotropic etching, such as wet etching using an alkaline solution. Further, at the end part of the memory area A, the end face of each non-doped silicon layer 36 is also removed (retreated).

At this time, as shown in FIG. 11(b), at the end part of the memory area A, the doped silicon layer 90 filled into the trench 22 is etched (retreated) from the top surface thereof. Accordingly, in the trench 22, the end faces of the plurality of non-doped silicon layers 36 are exposed in sequence from those positioned in the upper layers. Further, the end faces of the non-doped silicon layers 36 are removed (retreated) in sequence from the exposed end faces of the non-doped silicon layers 36 by wet etching. More specifically, at time t0, etching of an end face of an arbitrary non-doped silicon layer 36 is started and, at time t1, etching of an end face of a non-doped silicon layer 36 positioned in the lower layer of the above non-doped silicon layer 36 is started. In this case, the time difference t1-t0 is the time during which an amount of the doped silicon layer 90 corresponding to the film thickness between these non-doped silicon layers 36 is etched. Accordingly, among the plurality of laminated non-doped silicon layers 36, the higher the position of the non-doped silicon layer 36, the longer the etching time of the end face is, and hence the more the retreat amount of the end face is. That is, the end part of each of the plurality of laminated non-doped silicon layers 36 is formed into a step-like shape.

At this time, by appropriately adjusting the rate at which the doped silicon layer 90 is etched with respect to the rate at which the non-doped silicon layer 36 is etched, it is possible to make the difference in retreat amount of each non-doped silicon layer 36 constant. In other words, it is possible to make a difference in retreat amount between an arbitrary non-doped silicon layer 36, among the plurality of laminated non-doped silicon layers 36, and a non-doped silicon layer 36 positioned immediately above the arbitrary non-doped silicon layer 36, and a difference in retreat amount between the arbitrary non-doped silicon layer 36 and a non-doped silicon layer 36 positioned immediately below the arbitrary non-doped silicon layer 36 equal to each other.

As described above, it is possible to adjust the rate at which the doped silicon layer 90 is etched to the rate at which the non-doped silicon layer 36 is etched according to the difference in boron concentration. That is, a width (difference in retreat amount between an arbitrary non-doped silicon layer 36 and a non-doped silicon layer 36 positioned immediately above (below) the arbitrary non-doped silicon layer 36) of one step of each of the plurality of non-doped silicon layer 36 is determined according to the concentration of boron to be introduced into the doped silicon layer 90. For example, the higher the boron concentration, the lower the etching rate becomes and, the lower the boron concentration, the higher the etching rate becomes. Accordingly, in this step, the doped silicon layers 35 into which boron of high concentration has been introduced are hardly etched.

It should be noted that boron may also be introduced into the non-doped silicon layer 36, and it is sufficient if the boron concentration is lower than the boron concentration of the doped silicon layer 35 or 36. However, in order to make it easy to determine the etching selectivity of the non-doped silicon layer 36, and doped silicon layers 35 and 90, it is desirable that the boron concentration of the non-doped silicon layer 36 be 0 (boron is not introduced).

Further, the end face of each non-doped silicon layer 36 in the row direction is formed to further protrude from the upper side toward the lower side. In other words, the end face is formed to extend from the upper side toward the lower side.

Next, as shown in FIG. 12(b), at the end part of the memory area A, the end faces of the doped silicon layers 35 are removed (retreated) by isotropic etching, such as CDE.

At this time, the removal is carried out by isotropic etching, and hence the end part of each doped silicon layer 35 is fabricated along the non-doped silicon layer 36 formed into a step-like shape. More specifically, the end face of each doped silicon layer 35 is etched along the end face of a non-doped silicon layer 36 positioned immediately above the doped silicon layer 35. Thereby, among the plurality of laminated doped silicon layers 35, the end part of a doped silicon layer 35 positioned in the higher layer is more retreated. In other words, among the plurality of laminated doped silicon layers 35, the end face of a doped silicon layer 35 positioned in the lower layer is more protruded. That is, the end part of each of the plurality of laminated doped silicon layers 35 is formed into a step-like shape. Further, the end face of each doped silicon layer 35 is etched in such a manner that the end face thereof is retreated from the end face of a non-doped silicon layer 36 positioned immediately above the doped silicon layer 35, and is formed in such a manner that the end face is protruded from the end face of a non-doped silicon layer 36 positioned further above the non-doped silicon layer 36.

It should be noted that although not shown, the end face of each doped silicon layer 35 in the row direction is formed to further protrude from the upper side toward the lower side. In other words, the end face thereof is formed into a sloped shape extending from the upper side toward the lower side.

Next, as shown in FIG. 13(a) and FIG. 13(b), by exposing the memory area to hydrofluoric vapor, the boron-added silicon oxide film 37 is removed. At this time, the boron-added silicon oxide film 37 differs from other silicon oxide films (for example, silicon oxide film 37 or the like) in etching selectivity, and hence the other silicon oxide films are not removed.

Next, as shown in FIG. 13(b), at the end part of the memory area A, a silicon oxide film 120 is formed on the whole surface, and the step-like part of the laminated film and trench 22 are buried. That is, the silicon oxide film 120 is formed to cover the end faces of the doped silicon layers 35, and end faces and top surfaces of the non-doped silicon layers 36. Thereafter, the top surface of the silicon oxide film 120 is planarized by chemical mechanical polishing (CMP).

On the other hand, as shown in FIG. 13(a), at the central part of the memory area A, a boron-introduced doped polysilicon layer 121 which becomes the selection gate SG is formed on the uppermost non-doped silicon layer 36.

Next, as shown in FIG. 14(a), a pair of through holes of the U-shaped memory hole 130 is formed in the doped polysilicon layer 121, non-doped silicon layers 36, doped silicon layers 35, and silicon oxide film 34. The through holes are formed to expose the top surface of each end part of the sacrificial layer 33 in the column direction.

Next, as shown in FIG. 15(a) and FIG. 15(b), wet etching using an alkaline solution is carried out through the through holes. Thereby, the non-doped silicon layers 36 are removed. As a result, gaps 140 are formed between the plurality of doped silicon layers 35 (control gates CG), doped polysilicon layer 121, and silicon oxide film 120.

Here, as shown in FIG. 15(b), at the end part of the memory area A, the end part of each gap 140 is formed to protrude from the end part of a doped silicon layer 35 positioned immediately below the gap 140.

At the same time, as shown in FIG. 15(a), at the central part of the memory area A, the sacrificial layers 33 constituted of the non-doped polysilicon are also removed. Thereby, a coupling hole connecting the pair of through holes at the lower ends of the through holes is formed in the conductive layer 32, and the U-shaped memory hole 130 constituted of the pair of through holes, and coupling hole is formed.

Next, as shown in FIG. 16(a), and FIG. 16(b), in the U-shaped memory hole 130, the memory film 155 constituted of a block insulating film 150, charge storage layer 151, and tunnel insulating film 152, and a U-shaped silicon pillar SP constituted of the pair of pillar-shaped sections and coupling section are formed.

More specifically, as shown in FIG. 6(a), at the central part of the memory area A, a block insulating film 150 constituted of a silicon oxide film 150a, silicon nitride film 150b, and silicon oxide film 150c is formed on the inner surface of the through hole by, for example, atomic layer deposition (ALD). That is, the silicon oxide film 150a, silicon nitride film 150b, and silicon oxide film 150c each constituting the multilayer structure are formed in the order mentioned on the surface of the control gate CG (doped silicon layer 35) in the through hole.

Further, the block insulating film 150 is also formed on the inner surface of the gap 140 through the through hole. That is, the multilayer structure constituted of the silicon oxide film 150a, silicon nitride film 150b, and silicon oxide film 150c is also formed on the surface of the control gate CG in the gap 140. Thereby, the inter-electrode insulating film 150' integral with the block insulating film 150 is filled into gap 140. In the example shown in FIG. 6(a), the inter-electrode insulating film 150' is formed from the outer side (from the silicon oxide film 120 side, and from the control gate CG side positioned above or below) in the order of the silicon oxide film 150', silicon nitride film 150'b, and silicon oxide film 150'c. Further, when the silicon oxide film 150'c is formed, the inside of the gap 140 is filled up.

At this time, as shown in FIG. 6(b), at the end part of the memory area A, too, the block insulating film 150 is formed on the inner surface of the gap 140 through the through hole. That is, at the end part of the memory area A, too, the silicon oxide film 150'a, silicon nitride film 150'b, and silicon oxide film 150'c are formed in the gap 140 in the order mentioned. Thereby, the inter-electrode insulating film 150' integral with the block insulating film 150 is filled into the gap 140. That is, the inter-electrode insulating film 150' is formed as a laminated structure in which the silicon oxide film 150'a, silicon nitride film 150'b, and silicon oxide film 150'c are laminated from the outer side in the order mentioned.

Further, as described above, at the end part of the memory area A, the end face of the gap 140 protrudes from the end face of the doped silicon layer 35 positioned immediately below the gap 140. Accordingly, the end face of the inter-electrode insulating film 150' to be filled into the gap 140 is formed to protrude from the end face of the doped silicon layer 35 positioned immediately below the inter-electrode insulating film 150'. That is, the upper part of the end face of the doped silicon layer 35 is covered with the inter-electrode insulating film 150'.

Next, as shown in FIG. 6(a), at the central part of the memory area A, a charge storage layer 151 constituted of a silicon nitride film is formed on the surface of the block insulating film 150 (and inter-electrode insulating film 150') in the through hole. Thereafter, a tunnel insulating film 152 constituted of a silicon oxide film is formed on the charge storage layer 151 in the through hole. In the manner described above, the memory film 155 constituted of the block insulating film 150, charge storage layer 151, and tunnel insulating film 152 is formed.

It should be noted that in FIG. 6(a) and FIG. 6(b), although an example in which when the silicon oxide film 150'c is formed, the inside of the gap 140 is filled up has been shown, when the charge storage layer 151 or the tunnel insulating film 152 is formed, the inside of the gap 140 may be filled up.

Thereafter, polysilicon containing therein impurities such as phosphorus is filled into the through hole to cover the surface of the memory film 155. Thereby, the pillar-shaped sections of the U-shaped silicon pillar SP are formed in the through hole.

Further, simultaneously with the above step, on the inner surface of the coupling hole, too, a similar structure is formed. That is, on the surface of the silicon oxide film 34 in the coupling hole, and on the surface of the conductive layer 32 therein, a block insulating film 150, charge storage layer 151, tunnel insulating film 152, and polysilicon (U-shaped silicon pillar SP) are formed in the order mentioned.

Next, as shown in FIG. 17(a), at the central part of the memory area A, an opening section 180 is formed in the doped polysilicon layer 121 by RIE. The opening section 180 is formed in the row direction to penetrate the doped polysilicon layer 121. Thereby, the opening section 180 divides the doped polysilicon layer 121 into parts for each pillar-shaped section of the U-shaped silicon pillar. A silicon nitride film (insulating material) is filled into the opening section, and the divided parts of the doped polysilicon layer are insulation-isolated.

Next, as shown in FIG. 17(a) and FIG. 17(b), at the central part of the memory area, and at the end part of the memory area, a silicon oxide film 160 is formed on the whole surface.

Thereafter, at the central part of the memory area A, an opening section (not shown) configured to expose the top surface of the U-shaped silicon pillar is formed by lithography or RIE, and then polysilicon is filled into the opening section. Thereby, the U-shaped silicon pillar is extended to the upper side to be connected to a source line SL to be described later. Thereafter, at the central part of the memory area A, and at the end part of the memory area A again, a silicon oxide film 160 is formed on the whole surface.

Figure 17:
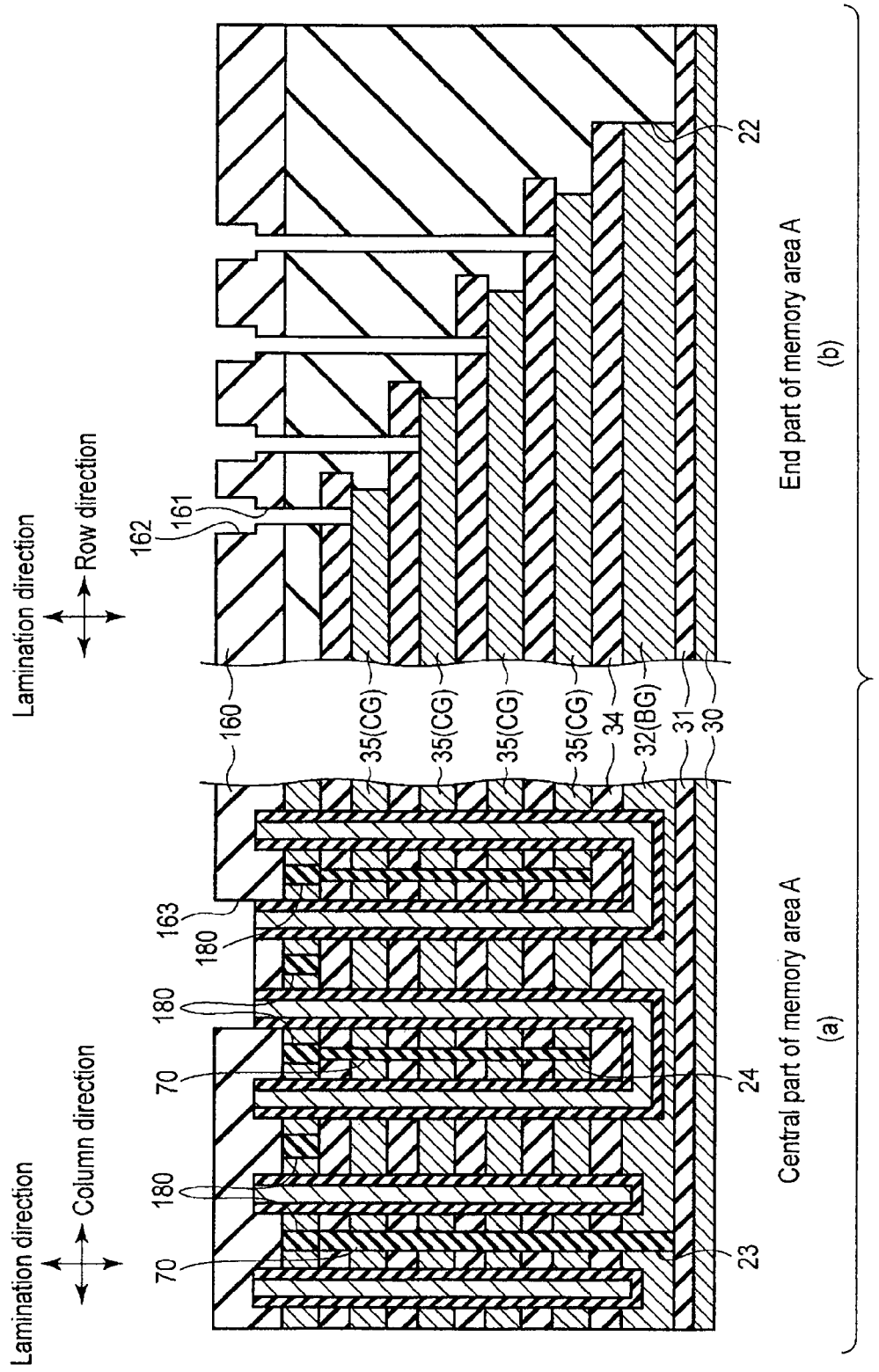
FIG. 17 is a cross-sectional view showing the manufacturing process of the semiconductor memory device according to the first embodiment subsequent to FIG. 16.

Next, as shown in FIG. 17(*a*), at the central part of the memory area A, a source line wiring trench 163 in which a source line SL is to be formed is formed in the silicon oxide film 160 by lithography and RIE in such a manner that the top surface of one of the pair of pillar-shaped sections of the U-shaped silicon pillar is exposed, the one of the pillar-shaped sections being the pillar-shaped section constituting the source side selection transistor SSTr.

At the same time, as shown in FIG. 17(*b*), at the end part of the memory area A, wiring trenches 162 are formed in the silicon oxide film 160 by lithography and RIE. A contact hole 161 is formed from the bottom of each wiring trench 162 by lithography and RIE. The contact hole 161 is formed to penetrate the silicon oxide film 160, silicon oxide film 120, and inter-electrode insulating film 150', and reach the top surface of the protruding end part of each doped silicon layer 35. At this time, the plurality of contact holes 161 formed to reach the corresponding doped silicon layers 35, and having different depths are formed simultaneously, and the inter-electrode insulating film 150' formed immediately above each doped silicon layer 35 functions as an etching stopper.

Next, as shown in FIG. 5(*a*), at the central part of the memory area A, a conductive material is filled into the source line wiring trench 163, and a source line SL is formed. At the same time, as shown in FIG. 5(*b*), at the end part of the memory area A, a conductive material is filled into the contact holes 161, and wiring trenches 162, and contacts 164, and wirings 165 are formed.

Next, at the central part of the memory area A, and at the end part of the memory area A again, a silicon oxide film 160 is formed on the whole surface. Thereafter, at the central part of the memory area A, an opening section (not shown) is formed in the silicon oxide film 160 by lithography and RIE in such a manner that the top surface of one of the pair of pillar-shaped sections of the U-shaped silicon pillar is exposed, the one of the pillar-shaped sections being the pillar-shaped section constituting the drain side selection transistor SDTr, and a conductive material is filled into the opening section. Thereby, the U-shaped silicon pillar is extended to the upper side to be connected to a bit line BL to be described later. Thereafter, a silicon oxide film is formed on the whole surface, then a bit line wiring trench (not shown) is formed, and a conductive material is filled into the bit line wiring trench, whereby a bit line BL is formed.

In the manner described above, the semiconductor memory device according to the first embodiment is formed.

[Advantage]

According to the above-mentioned first embodiment, the doped silicon layers 35 which become the control gates CG, and the non-doped silicon layers 36 which are sacrificial layers are laminated and, thereafter the end part of each non-doped silicon layer 36 is formed into the step-like structure by wet etching. Thereafter, by carrying out isotropic etching along each step-like non-doped silicon layer 36, the end part of each control gate CG is formed into the step-like structure. As a result, by carrying out each of wet etching, and isotropic etching once, it is possible to form the end part of each control gate CG into the step-like shape. That is, according to the method described above, it is possible to reduce the number of steps as compared with the conventional method in which resist slimming and RIE are repetitively carried out for each layer to thereby form the step-like structure. As a result, it is possible to realize a reduction in the manufacturing time, high yields, and a reduction in process cost.

Further, immediately above each of the plurality of control gates CG formed into the step-like shape, an inter-electrode insulating film 150' constituted of the laminated film of silicon oxide films 150'*a*, and 150'*c*, and silicon nitride film 150'*b* is formed. The end face of each inter-electrode insulating film 150' is formed to protrude from the end face of the control gate CG positioned immediately below the film 150'. Thereby, when a plurality of contact holes 161 each having different depths are simultaneously formed on the end parts of the plurality of control gates CG, it is possible to use each inter-electrode insulating film 150' as an etching stopper.

Furthermore, at the end part of the memory area A, the trench 22 configured to form the plurality of control gates CG into the step-like shape is formed simultaneously with the slit 23 configured to divide the block BLK into parts at the central part of the memory area A, and the slit 24 configured to divide the pair of pillar-shaped sections of the NAND string 300. That is, the lithography step used to form the trench 22 can be used in common with the other step (forming step of the slits 23 and 24), and the number of steps can further be reduced. Further, the slits 23, and 24, are formed simultaneously with the trench 22, and hence it is not necessary to consider the misalignment between them. Accordingly, it is possible to reduce the alignment margin of the step fabrication part, reduce the area occupied by the step fabrication part, and reduce the chip area.

It should be noted that the structure described in this embodiment is an example, and is not limited to the example. This embodiment can be generally applied to three-dimensional memories in which the gate electrode has the step-like structure at the end part thereof.

Second Embodiment

Figure 18:
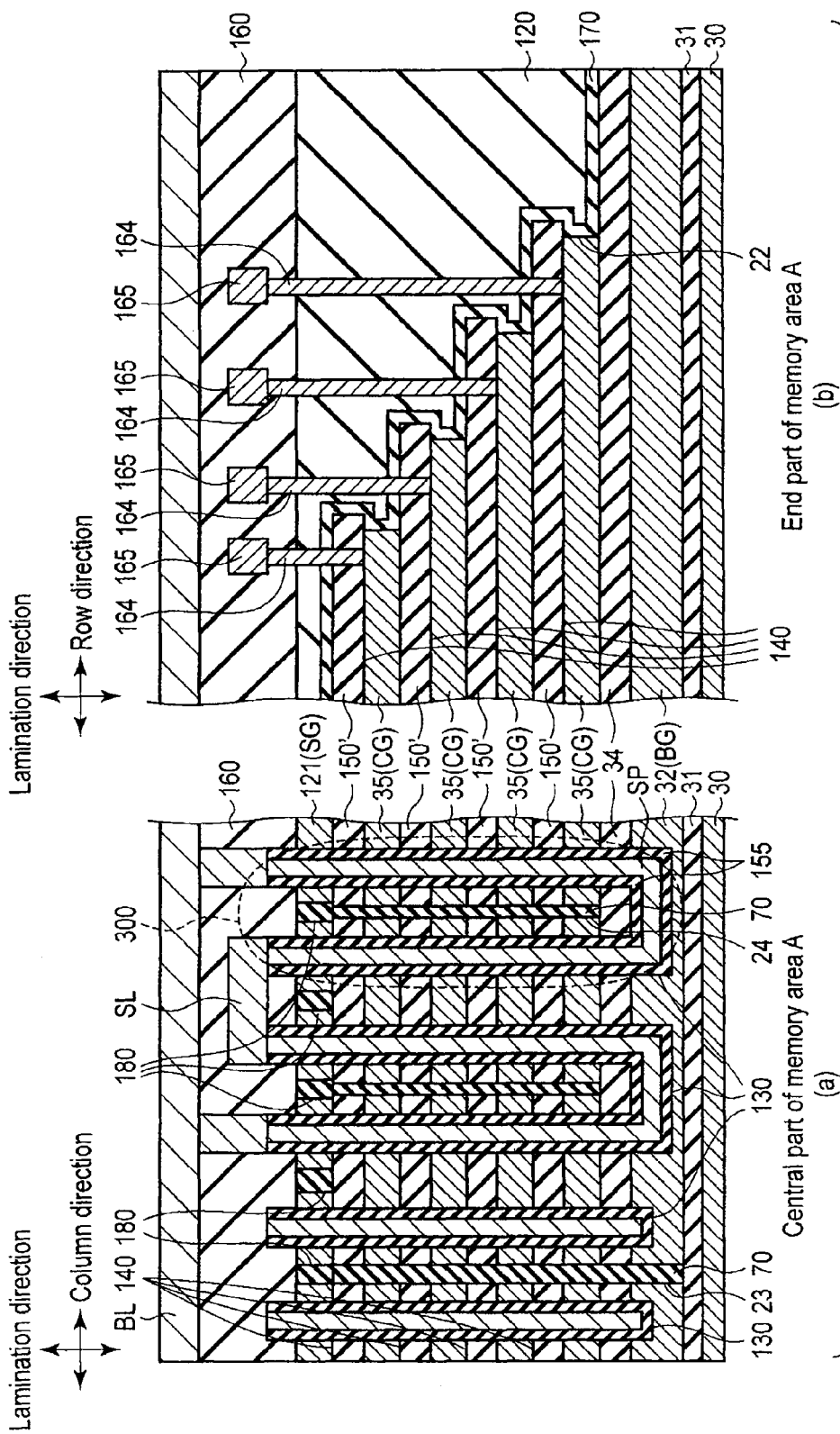
FIG. 18 is a cross-sectional view showing a semiconductor memory device according to a second embodiment.

A semiconductor memory device according to a second embodiment will be described below by using FIG. 18, and FIG. 19. The second embodiment is an example in which after the end part of each control gate CG is formed into the step-like structure, as the etching stopper to be used when the contact holes 161 are formed, not only the inter-electrode insulating films 150' are formed, but also a silicon nitride film 170 is formed on the whole surface of the step-like structure. It should be noted that in the second embodiment, a description of points identical to the first embodiment will be omitted, and only points different from the first embodiment will be described.

[Structure]

Hereinafter, the structure of the semiconductor memory device according to the second embodiment will be described by using FIG. 18. FIG. 18 is a cross-sectional view showing the semiconductor memory device according to the second embodiment. More specifically, FIG. 18(*a*) is a cross-sectional view showing the central part of a memory area A, and FIG. 18(*b*) is a cross-sectional view showing an end part of the memory area A.

In the second embodiment, the point different from the first embodiment is that at the end part of the memory area A, a silicon nitride film 170 is formed to cover the end faces of the plurality of laminated control gates CG, and end faces and top surfaces of the inter-electrode insulating films 150'.

That is, at the end part of the memory area A, the silicon nitride film 170 is formed between the plurality of control gates CG, and inter-electrode insulating films 150', and the silicon oxide film 120. Thereby, when a contact hole 161 is formed on the end part of each control gate CG, it is possible to use not only the inter-electrode insulating films, but also silicon nitride film 170 as the etching stopper.

[Manufacturing Method]

Hereinafter, a method of manufacturing the semiconductor memory device according to the second embodiment will be described by using FIG. 19. FIG. 19 is a cross-sectional view showing the manufacturing process of the semiconductor memory device according to the second embodiment. More specifically, FIG. 19(a) is a cross-sectional view showing the manufacturing process at the central part of the memory area A, and FIG. 19(b) is a cross-sectional view showing the manufacturing process at the end part of the memory area A.

First, the process from FIG. 7(a), 8(a), 9(a), 10(a), 11(a) and FIG. 12(a) at the central part of the memory area A, and the process from FIG. 7(b), 8(b), 9(b), 10(b), 11(b) and FIG. 12(b) at the end part of the memory area A are carried out. That is, as shown in FIG. 12(b), an end part of each of a plurality of laminated non-doped silicon layers 36, and a plurality of doped silicon layers 35 is formed into a step-like shape. At this time, the end face of each doped silicon layer 35 is formed to retreat from the end face of a non-doped silicon layer 36 positioned immediately above the doped silicon layer 35.

Next, as shown in FIG. 19(a) and FIG. 19(b), by exposing the memory area to hydrofluoric vapor, the boron-added silicon oxide film 37 is removed.

Next, as shown in FIG. 19(b), at the end part of the memory area A, a silicon nitride film 170 is formed on the whole surface by, for example, CVD. That is, the silicon nitride film 170 is formed to cover the end faces of the doped silicon layers 35, and end faces and top surfaces of the non-doped silicon layers 36. In other words, the silicon nitride film 170 is formed to cover the exposed surfaces of the doped silicon layers 35, and non-doped silicon layers 36.

Thereafter, at the end part of the memory area A, a silicon oxide film 120 is formed on the whole surface to cover the step-like section of the laminated film, and fill the trench 22 with the silicon oxide film 120. That is, the silicon oxide film 120 is formed on the silicon nitride film 170. Thereafter, the top surface of the silicon oxide film 120 is planarized by CMP.

On the other hand, as shown in FIG. 19(a), at the central part of the memory area A, a boron-introduced doped polysilicon layer 121 which becomes the selection gate SG is formed on the uppermost non-doped silicon layer 36.

Thereafter, the process from FIG. 14(a), 15(a), 16(a) and FIG. 17(a) at the central part of the memory area A, and the process from FIG. 14(b), 15(b), 16(b) and FIG. 17(b) at the end part of the memory area A are carried out.

It should be noted that as shown in FIG. 17(b), at the end part of the memory area A, the contact hole 161 is formed to penetrate the silicon oxide film 160, silicon oxide film 120, silicon nitride film 170, and inter-electrode insulating film 150', and reach the top surface of the protruding end part of each doped silicon layer 35. At this time, not only the inter-electrode insulating film 150' formed immediately above each doped silicon layer 35, but also the silicon nitride film 170 function as an etching stopper.

[Advantage]

According to the above-mentioned second embodiment, an advantage identical to the first embodiment can be obtained.

Furthermore, in the second embodiment, after the end part of each control gate CG is formed into the step-like structure, the silicon nitride film 170 is formed on the whole surface to cover the step-like structure of each control gate CG. Thereby, when a plurality of contact holes 161 each having different depths are formed, it is possible to use not only the inter-electrode insulating film 150', but also the silicon nitride film 170 as an etching stopper. Accordingly, the etching controllability at the time of forming the contact hole 161 is improved, and a process providing higher yields can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate;
   a laminated body including a first silicon layer, a first insulating film, a second silicon layer, and a second insulating film which are laminated on the substrate in turn, and including a first region being a central part in which a memory cell is disposed and a second region being an end part in which a contact is disposed;
   a semiconductor layer, in the first region, disposed in a hole penetrating the laminated body in a first direction perpendicular to a surface of the substrate;
   a first memory film disposed between the first silicon layer and the semiconductor layer;
   a second memory film disposed between the second silicon layer and the semiconductor layer;
   a first contact, in the second region, connected to the first silicon layer and extending in the first direction; and
   a second contact, in the second region, connected to the second silicon layer and extending in the first direction,
   wherein in the second region,
   an end face of the first silicon layer is formed to protrude from an end face of the second silicon layer in a second direction parallel to the surface of the substrate,
   an end face of the first insulating film is formed to protrude from the end face of the first silicon layer in the second direction, and
   an end face of the second insulating film is formed to protrude from the end face of the second silicon layer and not to protrude from the end face of the first silicon layer in the second direction.

2. The device of claim 1, wherein the end face of each of the first silicon layer, the first insulating film, the second silicon layer, and the second insulating film is formed into a sloped shape extending from the upper side toward the lower side.

3. The device of claim 2, wherein the end face of each of the first silicon layer, the first insulating film, the second silicon layer, and the second insulating film extends from the upper side toward the lower side curvilinearly and continuously.

4. The device of claim 1, wherein the first insulating film and the second insulating film are each integral with the block insulating film.

5. The device of claim 4, wherein each of the first insulating film and the second insulating film includes a laminated structure formed by laminating at least a first silicon oxide film, a silicon nitride film, and a second silicon oxide film in turn from the outermost surface side.

6. The device of claim 1, further comprising a third insulating film covering the whole surface of the first silicon layer, the first insulating film, the second silicon layer, and the second insulating film at the end part.

7. The device of claim 6, wherein the third insulating film is a silicon nitride film.

8. The device of claim 1, wherein the first contact is disposed between the end face of the second insulating film and the end face of the first silicon layer in the second direction.

* * * * *